United States Patent
Sato et al.

(10) Patent No.: US 9,230,831 B2
(45) Date of Patent: Jan. 5, 2016

(54) SEMICONDUCTOR DEVICE AND A MANUFACTURING METHOD THEREOF

(71) Applicant: RENESAS ELECTRONICS CORPORATION, Kawasaki-shi, Kanagawa (JP)

(72) Inventors: Yukihiro Sato, Kanagawa (JP); Nobuya Koike, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/613,179

(22) Filed: Feb. 3, 2015

(65) Prior Publication Data
US 2015/0187606 A1   Jul. 2, 2015

Related U.S. Application Data

(62) Division of application No. 13/771,235, filed on Feb. 20, 2013, now Pat. No. 8,975,733.

(30) Foreign Application Priority Data

Mar. 23, 2012 (JP) .................................. 2012-066997

(51) Int. Cl.
*H01L 21/44* (2006.01)
*H01L 21/48* (2006.01)
(Continued)

(52) U.S. Cl.
CPC .............. *H01L 21/561* (2013.01); *H01L 21/58* (2013.01); *H01L 23/4334* (2013.01); *H01L 23/49517* (2013.01); *H01L 23/49575* (2013.01); *H01L 24/24* (2013.01); *H01L 24/85* (2013.01); *H01L 25/0657* (2013.01); *H01L 24/32* (2013.01); *H01L 24/45* (2013.01); *H01L 24/48* (2013.01);
(Continued)

(58) Field of Classification Search
CPC ..................... H01L 23/055; H01L 2924/1532; H01L 21/58
USPC ............ 438/123; 257/666, E21.506, E21.509
See application file for complete search history.

(56) References Cited

U.S. PATENT DOCUMENTS 5,889,318 A * 3/1999 Corisis ......................... 257/670
6,338,984 B2 * 1/2002 Minamio et al. ............. 438/123
(Continued)

FOREIGN PATENT DOCUMENTS

| JP | 54-111766 A | 9/1979 |
|---|---|---|
| JP | 08-222673 A | 8/1996 |
| JP | 2002-134677 A | 5/2002 |
| JP | 2005-302905 A | 10/2005 |
| JP | 2006-049842 A | 2/2006 |

(Continued)

OTHER PUBLICATIONS

Office Action issued Jun. 2, 2015, in Japanese Patent Application No. 2012-066997.

*Primary Examiner* — Nitin Parekh
(74) *Attorney, Agent, or Firm* — Miles & Stockbridge P.C.

(57) ABSTRACT

There is provided a technology enabling the improvement of the reliability of a semiconductor device manufactured by physically fixing separately formed chip mounting portion and lead frame. A feature of an embodiment resides in that, a second junction portion formed in a suspension lead is fitted into a first junction portion formed in a chip mounting portion, thereby to physically fix the chip mounting portion and the suspension lead. Specifically, the first junction portion is formed of a concave part disposed in the surface of the chip mounting portion. The second junction portion forms a part of the suspension lead.

4 Claims, 26 Drawing Sheets

(51) Int. Cl.
- *H01L 21/56* (2006.01)
- *H01L 23/495* (2006.01)
- *H01L 21/58* (2006.01)
- *H01L 23/00* (2006.01)
- *H01L 23/433* (2006.01)
- *H01L 25/065* (2006.01)

(52) U.S. Cl.
CPC .............. *H01L24/49* (2013.01); *H01L 24/92* (2013.01); *H01L 2224/291* (2013.01); *H01L 2224/32245* (2013.01); *H01L 2224/451* (2013.01); *H01L 2224/45124* (2013.01); *H01L 2224/45144* (2013.01); *H01L 2224/45147* (2013.01); *H01L 2224/48145* (2013.01); *H01L 2224/48245* (2013.01); *H01L 2224/48247* (2013.01); *H01L 2224/48463* (2013.01); *H01L 2224/49171* (2013.01); *H01L 2224/49175* (2013.01); *H01L 2224/49177* (2013.01); *H01L 2224/73265* (2013.01); *H01L 2224/85181* (2013.01); *H01L 2224/85205* (2013.01); *H01L 2224/92247* (2013.01); *H01L 2225/0651* (2013.01); *H01L 2225/06506* (2013.01); *H01L 2924/1305* (2013.01); *H01L 2924/1306* (2013.01); *H01L 2924/13091* (2013.01); *H01L 2924/386* (2013.01)

(56) References Cited

U.S. PATENT DOCUMENTS

| | | | |
|---|---|---|---|
| 6,828,659 B2 * | 12/2004 | Iwakiri | 257/666 |
| 6,861,734 B2 | 3/2005 | Minamio et al. | |
| 6,995,459 B2 | 2/2006 | Lee et al. | |
| 7,095,100 B2 | 8/2006 | Kasuya | |
| 7,132,315 B2 | 11/2006 | Minamio et al. | |
| 7,332,804 B2 | 2/2008 | Miyake et al. | |
| 7,808,084 B1 | 10/2010 | Lee et al. | |
| 7,875,963 B1 * | 1/2011 | Kim et al. | 257/670 |
| 7,968,998 B1 * | 6/2011 | Choi | 257/693 |
| 7,989,933 B1 | 8/2011 | Kim et al. | |
| 8,076,183 B2 * | 12/2011 | Xue et al. | 438/123 |
| 8,441,110 B1 | 5/2013 | Choi | |
| 8,450,803 B2 | 5/2013 | Saito et al. | |
| 9,029,992 B2 * | 5/2015 | Kim et al. | 257/676 |
| 2005/0095409 A1 | 5/2005 | Koeda et al. | |
| 2011/0095409 A1 * | 4/2011 | Xue | H01L 21/4842 257/676 |
| 2011/0227208 A1 | 9/2011 | Kim et al. | |
| 2012/0049336 A1 | 3/2012 | Xue et al. | |
| 2013/0009300 A1 * | 1/2013 | Yato | H01L 24/92 257/676 |

FOREIGN PATENT DOCUMENTS

| | | |
|---|---|---|
| JP | 2009-289892 A | 12/2009 |
| JP | 2011-138809 A | 7/2011 |

\* cited by examiner

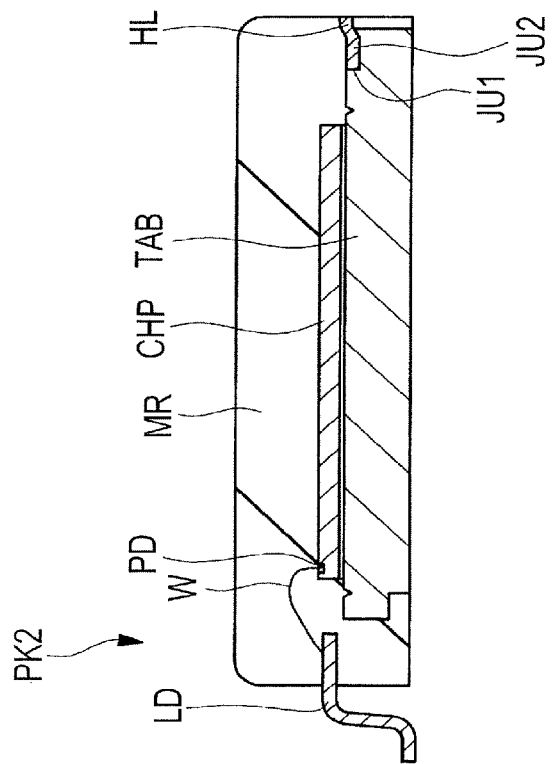

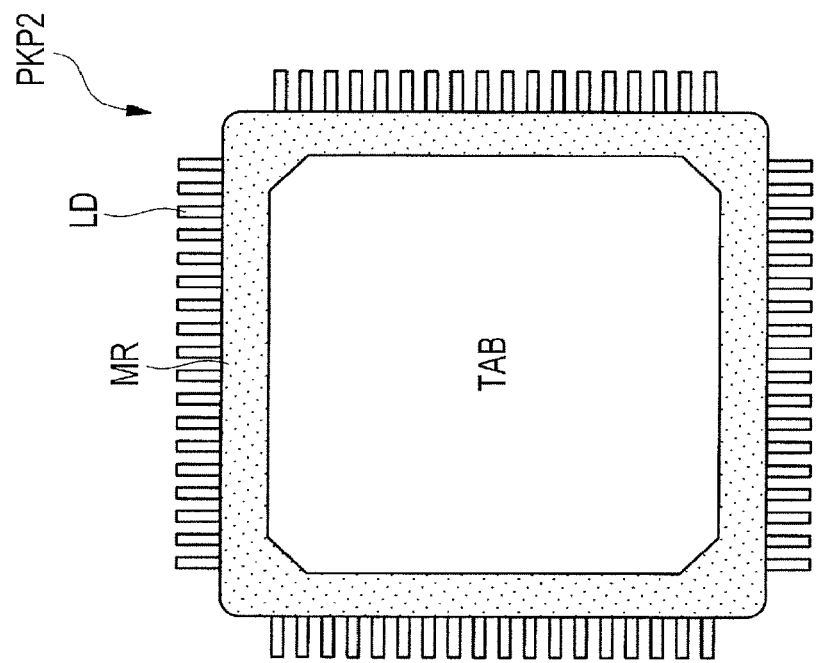
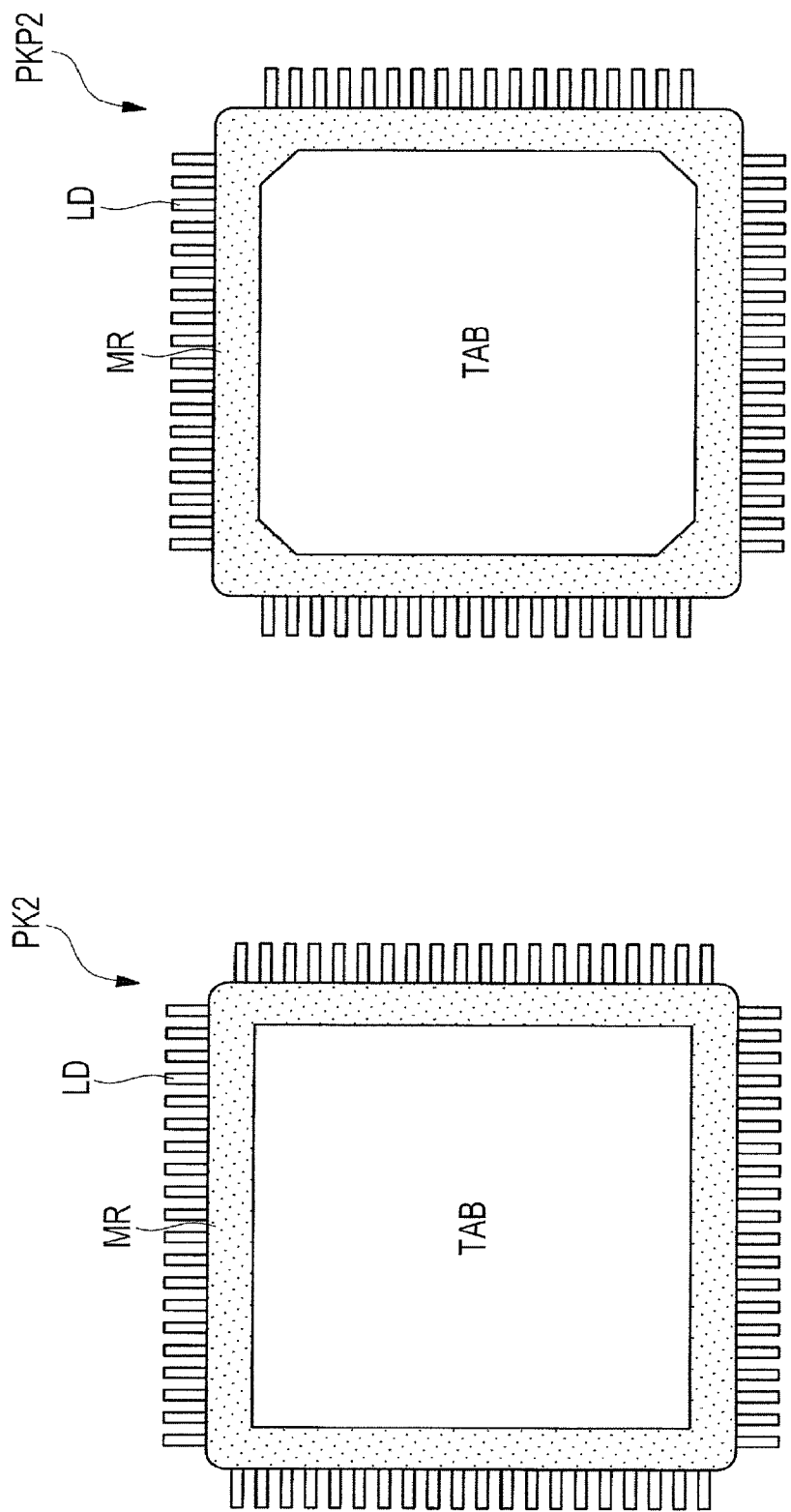

SEMICONDUCTOR DEVICE AND A MANUFACTURING METHOD THEREOF

CROSS-REFERENCE TO RELATED APPLICATIONS

The disclosure of Japanese Patent Application No. 2012-066997 filed on Mar. 23, 2012 including the specification, drawings and abstract is incorporated herein by reference in its entirety.

BACKGROUND

The present invention relates to a semiconductor device and a manufacturing technology thereof. More particularly, it relates to a semiconductor device (package) manufactured using a lead frame including a chip mounting portion for mounting a semiconductor chip physically fixed therein, and a technology effectively applicable to a manufacturing technology thereof.

Japanese Unexamined Patent Publication No. 2009-289892 (Patent Document 1) describes a technology of connecting a lead frame and a radiator plate by connection holes and projections. Specifically, projections are formed at a radiator plate, and connection holes are formed at prescribed sites of the lead frame respectively corresponding to the projections. Then, the projections formed at the radiator plate are fitted into the connection holes formed in the lead frame. As a result, the radiator plate and the lead frame are connected.

PATENT DOCUMENT

Patent Document 1

Japanese Unexamined Patent Publication No. 2009-289892

SUMMARY

A semiconductor device is formed of a semiconductor chip including semiconductor elements such as MOSFETs (Metal Oxide Semiconductor Field Effect Transistors) and a multilayer wiring formed therein, and a package formed in such a manner as to cover the semiconductor chip. The package has (1) a function of electrically coupling the semiconductor elements formed in the semiconductor chip with an external circuit, and (2) a function of protecting the semiconductor chip from external environment such as moisture and temperature, and preventing breakage by vibration or impact, and the characteristic deterioration of the semiconductor chip. Further, the package also has in combination (3) a function of facilitating handling of the semiconductor chip, (4) a function of dissipating the heat generated during operation of the semiconductor chip, and making full use of the functions of the semiconductor elements, and other functions.

As one form of such a package, there is established a technology of manufacturing a package (semiconductor device) by using a lead frame as represented by, for example, QFP (Quad Flat Package). Generally, a lead frame, and a chip mounting portion (header) for mounting a semiconductor chip thereover are often integrally formed. However, in order to improve the heat radiation efficiency of the chip mounting portion, there is a technology of making the chip mounting portion thicker than the lead frame. With this technology, the thickness of the chip mounting portion and the thickness of the lead frame are different. For this reason, it is difficult to integrally form the chip mounting portion and the lead frame. Accordingly, the chip mounting portion and the lead frame are formed as separate bodies. The separately formed chip mounting portion and lead frame are physically fixed. In this case, for example, the following method is commonly employed: the chip mounting portion is subjected to embossing, and a hole (pore) is opened at the position of the lead frame in alignment with the processed site; as a result, the projections formed at the chip mounting portion are inserted into the holes formed in the lead frame, respectively; then, the tops of the inserted projections are crushed, thereby to fix the chip mounting portion to the lead frame.

Herein, with the foregoing fixing method, in consideration of the manufacturing variations of the projections, and the smooth insertion of the projections into their respective holes, the hole diameter is larger than the projection diameter. For this reason, the projection can move while being inserted into the hole. Accordingly, the step of crushing the top of the inserted projection may be performed with the center of the projection in misalignment with the center of the hole. In this case, the crushed portion of the projection top is not formed in such a manner as to evenly press the perimeter of the hole, but is formed in such a manner as to press only a part of the perimeter of the hole. In such a fixed state, the chip mounting portion and the lead frame cannot be fixed firmly, resulting in the occurrence of looseness.

When such looseness occurs, for example, the lead frame may be deformed to cause poor compression bonding in a wire bonding step. Further, in a molding step (resin sealing step), when the lead frame is clamped in a metal mold, the deformation of the lead frame occurs, which may result in the occurrence of wire deformation or disconnection, the irregular shape of the resin sealing body, or the like. In other words, when the chip mounting portion and the lead frame are physically fixed by the foregoing common method, there is a high possibility of affecting the reliability of the manufactured semiconductor device (package).

It is an object of the present invention to provide a technology capable of improving the reliability of a semiconductor device manufactured by physically fixing separately formed chip mounting portion and lead frame.

The foregoing and other objects, and the novel features of the present invention will be apparent through the description provided in this specification and the accompanying drawings.

Summaries of the representative ones of the inventions disclosed in the present application will be described in brief as follows.

In a semiconductor device in one embodiment, fixing between a first member for mounting a semiconductor chip thereover and a suspension lead is performed by fitting a second junction portion of a suspension lead into a first junction portion formed of a concave part formed in the first member.

Further, a method for manufacturing a semiconductor device in another embodiment is characterized by manufacturing a semiconductor device using a lead frame in which a second junction portion of a suspension lead is fitted into a first junction portion formed of a concave part formed in a first member for mounting a semiconductor chip thereover, thereby to fix the first member to the suspension lead.

The effects obtainable by representative ones of the inventions disclosed in the present application will be described in brief as follows.

In accordance with one embodiment, it is possible to improve the reliability of a semiconductor device manufactured by physically fixing separately formed chip mounting portion and lead frame.

BRIEF DESCRIPTION OF THE DRAWINGS

FIG. 22A is a cross-sectional view cut along line A-A of FIG. 21A showing the first modified example, and FIG. 22B is a cross-sectional view cut along line B-B of FIG. 21B showing the study example;

FIG. 24A is a bottom view showing an outside configuration of the semiconductor device in the first modified example, and FIG. 24B is a bottom view showing an outside configuration of the semiconductor device in the study example;

DETAILED DESCRIPTION

Figure 1:
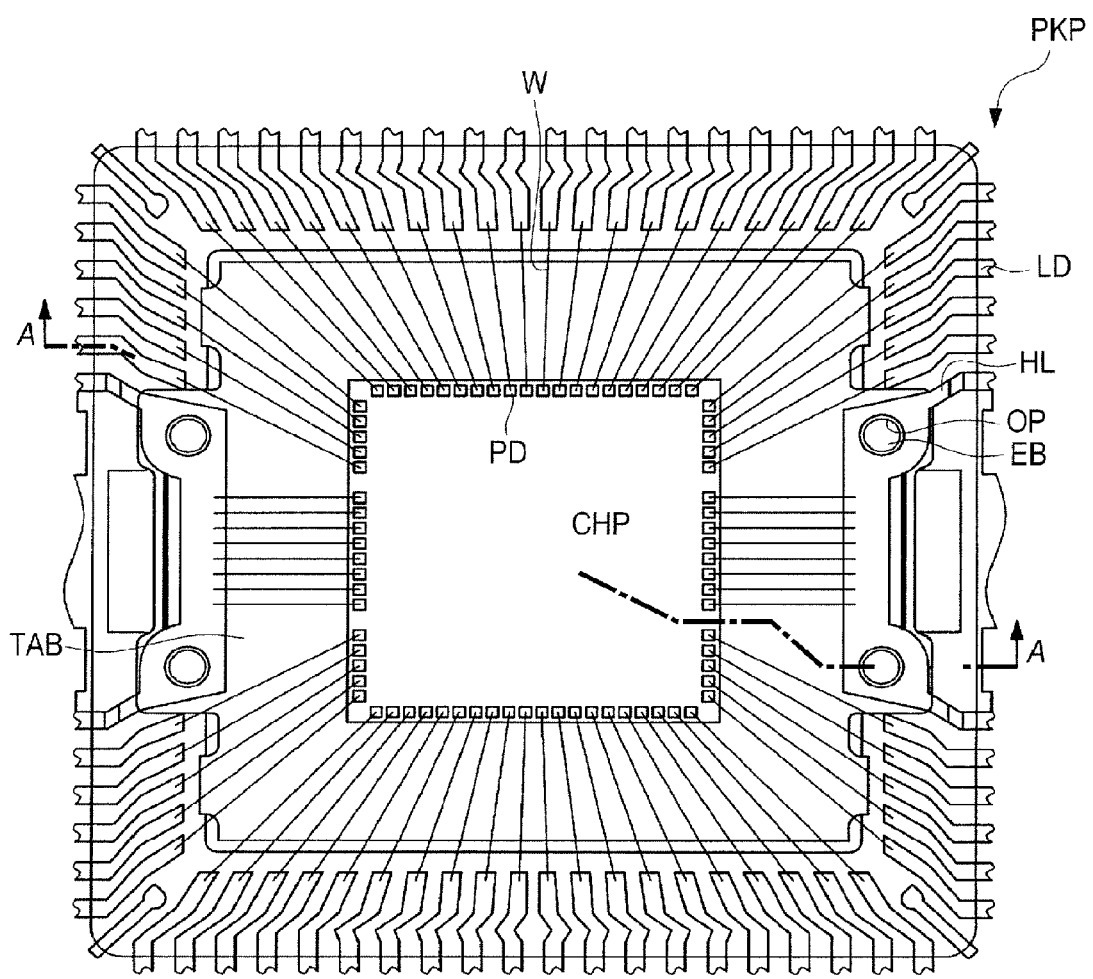
FIG. 1 is a view showing a configuration of a semiconductor device in the related art.

In the following embodiment, the embodiment may be described in a plurality of divided sections or embodiments for convenience, if required. However, unless otherwise specified, these are not independent of each other, but are in a relation such that one is a modified example, detailed explanation, complementary explanation, or the like of a part or the whole of the other.

Further, in the following embodiments, when a reference is made to the number of elements, and the like (including number, numerical value, quantity, range, or the like), the number of elements is not limited to the specific number, but may be greater than or less than the specific number, unless otherwise specified, and except the case where the number is apparently limited to the specific number in principle, and other cases.

Further, in the following embodiments, it is naturally understood that the constitutional elements (including element steps, or the like) are not always essential, unless otherwise specified, and except the case where they are apparently considered essential in principle, and other cases.

Similarly, in the following embodiments, when a reference is made to the shapes, positional relationships, or the like of the constitutional elements, or the like, it is understood that they include ones substantially analogous or similar to the shapes or the like, unless otherwise specified, unless otherwise considered apparently in principle, and except for other cases. This also applies to the foregoing numerical values and the ranges.

Further, in all the drawings for describing the embodiments, the same members are given the same reference signs and numerals in principle, and a repeated description thereon is omitted. Incidentally, for ease of understanding of the drawings, hatching may be provided even in a plan view.

<Details of Problem Found by the Present Inventors>

As one form of such a package, there is established a technology of manufacturing a package (semiconductor device) by using a lead frame as represented by, for example, QFP (Quad Flat Package). Generally, a lead frame, and a chip mounting portion (header) for mounting a semiconductor chip thereover are often integrally formed. However, in order to improve the heat radiation efficiency of the chip mounting portion, there is a technology of making the chip mounting portion thicker than the lead frame. With this technology, the thickness of the chip mounting portion and the thickness of the lead frame are different. For this reason, it is difficult to integrally form the chip mounting portion and the lead frame. Accordingly, the chip mounting portion and the lead frame are formed as separate bodies. The separately formed chip mounting portion and lead frame are physically fixed.

The following embodiments are intended for a package of a type in which, thus, a chip mounting portion and a lead frame are formed as separate bodies, and the chip mounting portion and the lead frame are physically fixed. First, the related-art package of the foregoing type will be briefly described. A description will be given to the details of the problems of the related-art package.

FIG. 1 is a view showing a configuration of a semiconductor device PKP in the related-art technology. In FIG. 1, the related-art semiconductor device PKP has a rectangular chip mounting portion TAB. Over the chip mounting portion TAB, there is mounted, for example, a semiconductor chip CHP in the form of a rectangle. At the outer edge part of the semiconductor chip CHP, there are arranged a plurality of pads PD. Then, around the chip mounting portion TAB, there are disposed a plurality of leads LD and suspension leads HL. The pads PD formed over the semiconductor chip CHP and the leads LD are electrically coupled with each other by wires W formed of, for example, a metal wire, respectively. On the other hand, at the chip mounting portion TAB, there are formed embossed parts (projecting parts) EB. The embossed parts EB are inserted into the openings (holes) OP formed in the suspension lead HL, respectively. As a result, the chip mounting portion TAB and the suspension lead HL are physically fixed with each other. Incidentally, the constituent elements of the semiconductor device PKP described in conjunction with FIG. 1 are sealed with a sealing body formed of, for example, a resin. However, FIG. 1 shows the sealing body as seen therethrough in order to illustrate the constituent elements inside the sealing body.

Figure 2:
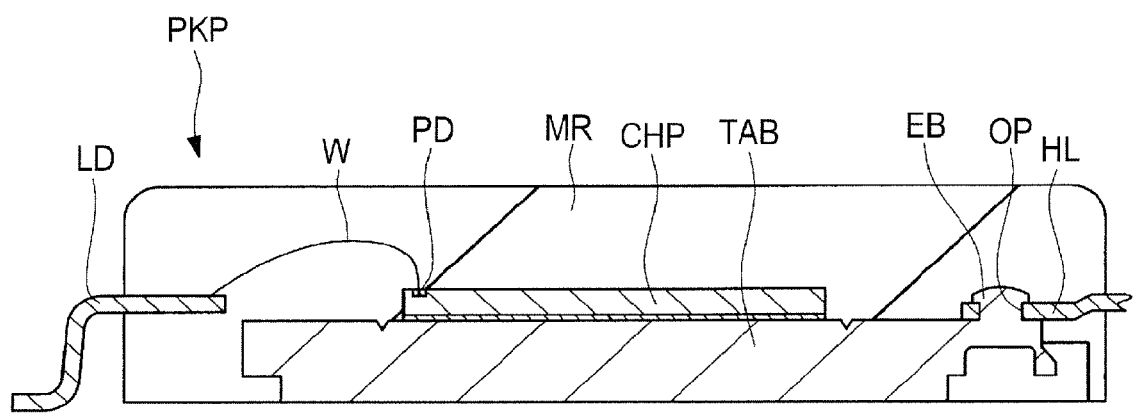
FIG. 2 is a cross-sectional view cut along line A-A of FIG. 1.

Subsequently, FIG. 2 is a cross-sectional view cut along line A-A of FIG. 1. As shown in FIG. 2, over the chip mounting portion TAB, there is mounted the semiconductor chip CHP via, for example, solder (not shown). Thus, each pad PD formed at the semiconductor chip CHP and each lead LD in the gull-wing shape disposed around the chip mounting portion TAB (e.g., on the left side of the chip mounting portion TAB shown in FIG. 2) are electrically coupled with each other by each wire W. On the other hand, in FIG. 2, on the right side of the chip mounting portion TAB, there is disposed the suspension lead HL. The suspension lead HL and the chip mounting portion TAB are physically fixed with each other. Specifically, the projection-like embossed part EB formed at the chip mounting portion TAB is inserted into the opening (hole) OP formed in the suspension lead HL, and, the top of the embossed part EB is physically crushed. As a result, the chip mounting portion TAB and the suspension lead HL are physically fixed with each other. Then, the top surface of the chip mounting portion TAB, the semiconductor chip CHP, each wire W, a part of each lead LD, and, each suspension lead HL are sealed by the sealing body MR. Incidentally, as apparent from FIG. 2, the thickness of the chip mounting portion TAB is sufficiently larger than the thickness of the lead LD and the thickness of the suspension lead HL. This results in a larger heat capacity of the chip mounting portion TAB. Whereas, the back surface (bottom surface) of the chip mounting portion TAB is exposed from the sealing body MR. Accordingly, the heat generated at the semiconductor chip CHP is efficiently dissipated from the chip mounting portion TAB to outside the semiconductor device PKP.

Figure 3:
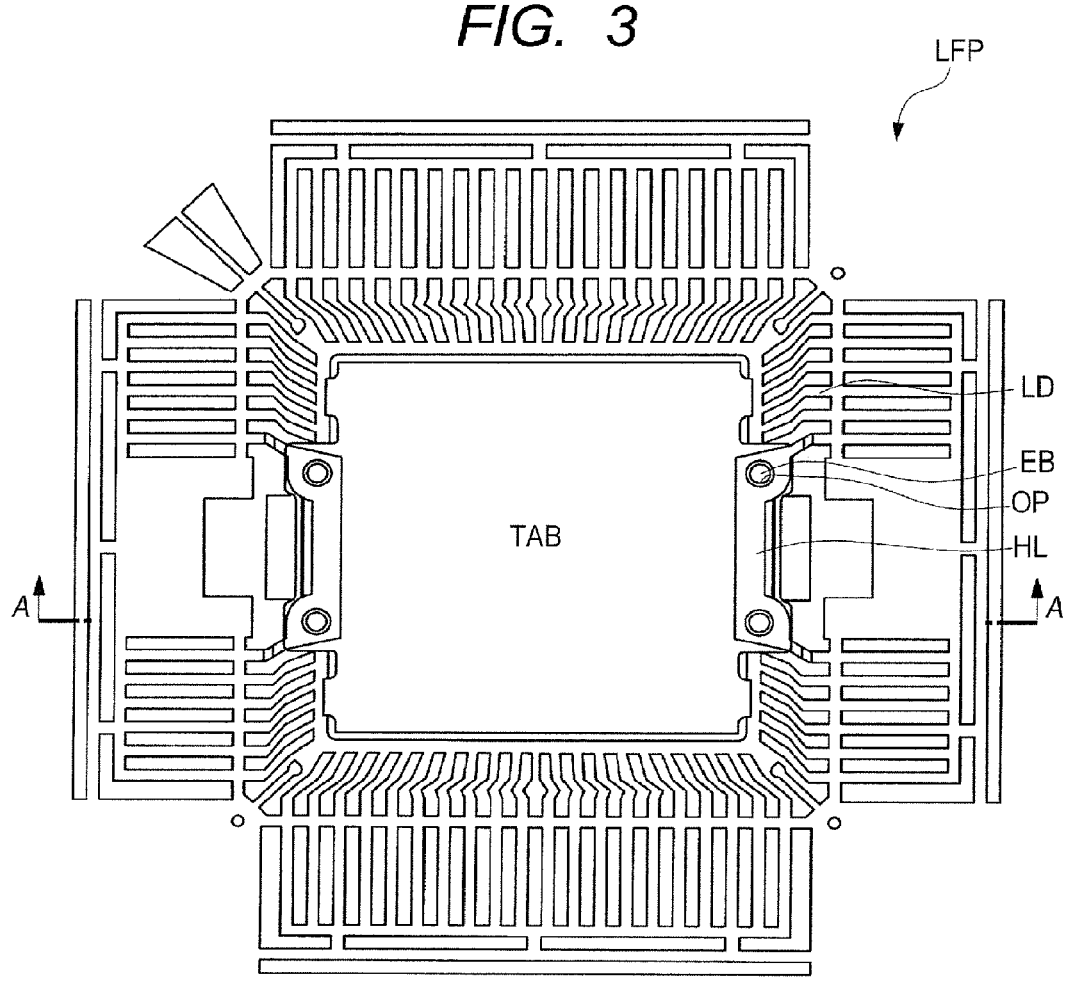
FIG. 3 is a plan view showing a configuration of a lead frame for use in manufacturing a semiconductor device of the related art.
Figure 4:
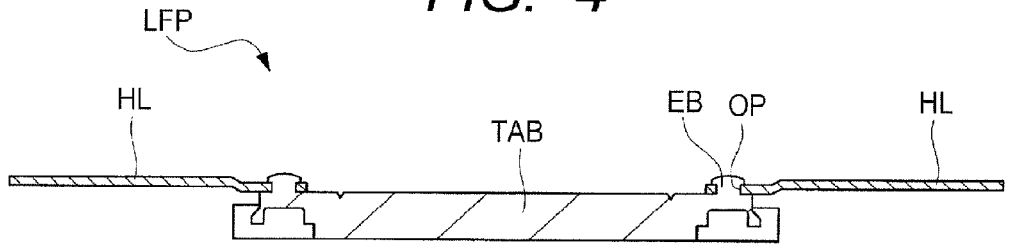
FIG. 4 is a cross-sectional view cut along line A-A of FIG. 3.

The semiconductor device PKP in the related art technology is formed as described above. Below, further, a description will be given to a configuration of a lead frame LFP for use during the manufacturing steps of the semiconductor device PKP. FIG. 3 is a plan view showing a configuration of the lead frame LFP for use in manufacturing the related-art semiconductor device PKP. FIG. 4 is a cross-sectional view cut along line A-A of FIG. 3. As shown in FIG. 3, in the related-art lead frame LFP, at the central part, there is disposed the chip mounting portion TAB formed as a separate body. Around the chip mounting portion TAB, there are disposed a plurality of leads LD and suspension leads HL. The plurality of the leads LD and the suspension leads HL are coupled with each other by a tie bar. The tie bar can prevent the resin from leaking through the gap between the plurality of leads LD when resin sealing is performed. Then, each suspension lead HL forming a part of the lead frame LFP and the chip mounting portion TAB are fixed with each other by respectively inserting the projection-like embossed parts EB formed at the chip mounting portion TAB into their corresponding openings OP formed in the suspension lead HL. Specifically, as shown in FIG. 4, some regions of the chip mounting portion TAB are subjected to embossing, thereby to form embossed parts EB projecting from the top surface (front surface) of the chip mounting portion TAB. Herein, embossing is defined as the following processing method: the back surface of the chip mounting portion TAB is pushed up, and the front surface corresponding to the back surface pushed up is raised, thereby to dent the back surface of the chip mounting portion TAB, and to form projection-like embossed parts EB at the front surface of the chip mounting portion TAB. Then, at some parts of the suspension lead LH disposed at the positions corresponding to the positions at which the embossed parts EB are formed, openings (holes) OP are disposed, respectively. Into the openings OP, the embossed parts EB are inserted, respectively. Then, the top of each embossed part EB inserted into each opening OP is crushed. As a result, the embossed part EB can be fixed while being inserted into the opening OP. In this manner, with the related-art technology, it is understood as follows: the embossed parts EB formed by subjecting the chip mounting portion TAB to embossing are inserted into the openings OP formed in the suspension lead HL, respectively, and the tops of the embossed parts EB are crushed; as a result, the chip mounting portion TAB and the suspension lead HL separated from each other as different bodies are physically fixed with each other.

However, the present inventors conducted a study on the fixing method by the foregoing embossing. As a result, they newly found that there are the following problems. Therefore, the problems will be described by reference to the accompanying drawings.

Figure 5:
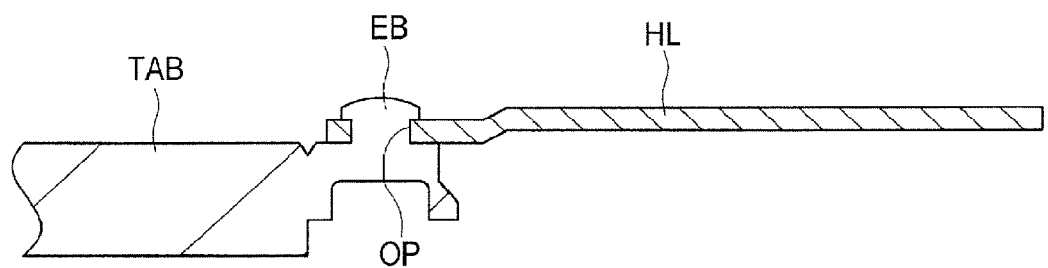
FIG. 5 is a cross-sectional view showing an ideal fixed state by embossing of a chip mounting portion and a suspension lead.

First, FIG. 5 is a cross-sectional view showing the ideal fixed state of the chip mounting portion TAB and the suspension lead HL by embossing. As shown in FIG. 5, the embossed part EB formed at the chip mounting portion TAB is firmly inserted into the opening (hole) OP formed in the suspension lead HL, and the top of the inserted embossed part EB is crushed. As a result, the chip mounting portion TAB and the suspension lead HL are surely fixed with each other. In such an ideal state, no gap is caused between the embossed part EB and the opening OP. For this reason, a problem of poor fixing is not caused. However, in actuality, fixing by the foregoing ideal embossing is less likely to be implemented. This raises a concern that the fixed state as shown in FIG. 6 is brought about.

Figure 6:
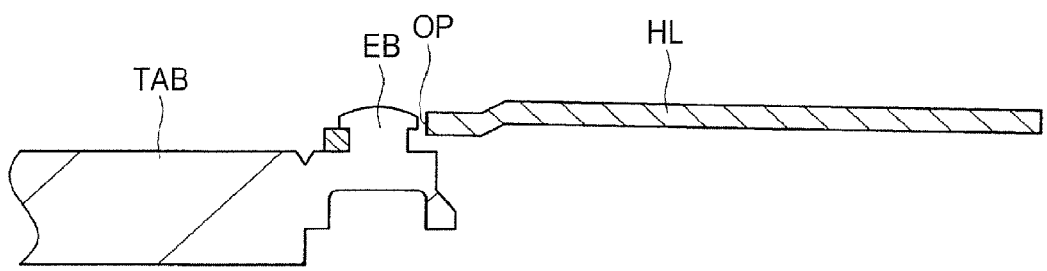
FIG. 6 is a cross-sectional view showing one example of the fixed state by embossing of the chip mounting portion and the suspension lead.

FIG. 6 is a cross-sectional view showing one example of the fixed state of the chip mounting portion TAB and the suspension lead HL by embossing. As shown in FIG. 6, in actuality, in consideration of the occurrence of variations in shape and diameter (width) of the embossed parts EB formed at the chip mounting portion TAB, and enabling the smooth insertion of the embossed part EB into the opening OP, the diameter of the opening OP formed in the suspension lead HL is set larger than the diameter of the embossed part EB for having a margin.

As a result, even when a certain degree of variations occur in diameter of the embossed parts EB, it is possible to avoid the disadvantage that the embossed part EB becomes unable to be inserted into the opening OP because the diameter of the opening OP is allowed to have a margin.

The configuration in which the diameter of the opening OP is thus allowed to have a margin can be said to a desirable configuration from the viewpoint of surely inserting the embossed part EB into the opening OP. However, on the other hand, the possibility of occurrence of poor fixing as shown in FIG. 6 increases.

In other words, the diameter of the opening OP formed in the suspension lead HL is larger than the diameter of the embossed part EB formed at the chip mounting portion TAB. For this reason, the embossed part EB can move while being inserted into the opening OP. This may result in that the step of crushing the top of the inserted embossed part EB is performed with the center of the embossed part EB and the center of the opening OP being misaligned with each other. Namely, depending upon the timing for crushing the top of the embossed part EB, as shown in FIG. 6, fixing may be achieved with the center of the embossed part EB and the center of the opening OP being in misalignment with each other.

Particularly, when the embossed part EB is fixed while being put aside in the opening OP, a large gap is created on the opposite side of the embossed part EB put aside. In this case, the crushed portion of the top of the embossed part EB is not formed in such a manner as to evenly press the periphery of the opening OP, but is formed in such a manner as to press only a part of the periphery of the opening OP.

As a result, poor fixing is caused between the embossed part EB and the opening OP, so that fixing between the chip mounting portion TAB and the suspension lead HL becomes unstable. In other words, the chip mounting portion TAB and the suspension lead HL are not fixed with reliability, resulting in the occurrence of looseness.

Particularly, when such looseness occurs, the opening OP and the crushed portion of the top of the embossed part EB interfere with each other, and wear each other. Accordingly, the diameter of the opening OP increases, and the crushed portion of the top of the embossed part EB becomes thinned. As a result, the looseness becomes worse. In a severe case, the embossed part EB may come out of the opening OP.

Furthermore, with embossing, the back surface of the chip mounting portion TAB is dented. Accordingly, even when the top of the embossed part EB is crushed with the chip mounting portion TAB fixed, a dent is formed in the back surface corresponding to the embossed part EB, and hence the back surface corresponding to the embossed part EB is raised even if the chip mounting portion TAB itself is fixed.

As a result, it is not possible to crush the top surface of the embossed part EB with the back surface corresponding to the embossed part EB firmly fixed. This results in a high possibility that fixing is achieved with the embossed part EB shifted as shown in FIG. 6. Namely, with the fixing method by embossing, the diameter of the opening OP formed in the suspension lead HL is set larger than the diameter of the embossed part EB, and the back surface corresponding to the embossed part EB is raised. With these as main factors, fixing between the chip mounting portion TAB and the suspension lead HL is not performed surely, resulting in a higher possibility of the occurrence of looseness.

Thus, when looseness occurs in fixing between the chip mounting portion TAB and the suspension lead HL, the lead frame LFP becomes more likely to be deformed. Then, the occurrence of deformation in the lead frame LFP adversely affects the wire bonding step of electrically coupling the pads formed at the semiconductor chip CHP and the leads formed at the lead frame. Specifically, in the wire bonding step, for example, using a capillary, a ball formed of a metal wire is first bonded on the pad formed at the semiconductor chip CHP. Then, while letting out a metal wire (wire) from the capillary, the capillary is moved to the lead. The capillary is pressed against the lead, thereby to second bond the metal wire (wire) to the lead. At this step, not only at the time of pressing the capillary against the pad, but also at the time of pressing the capillary against the lead, an ultrasonic wave is applied from the capillary to the lead, thereby to improve the compression bondability of the wire. However, when looseness occurs in fixing between the chip mounting portion TAB and the suspension lead HL, and the lead frame is deformed, it becomes impossible to firmly press the lead with the capillary. As a result, an ultrasonic wave is not sufficiently transmitted from the capillary to the lead, so that poor compression bonding of the wire to the lead becomes more likely to occur. Further, in the resin sealing step, resin sealing is performed with the lead frame clamped by a metal mold. However, when looseness occurs in fixing between the chip mounting portion TAB and the suspension lead HL, the deformation of the lead frame becomes more likely to occur when the lead frame is clamped by a metal mold. When such deformation of the lead frame is caused in the resin sealing step, a load is imposed on a wire for coupling the pad and the lead. This results in a higher possibility that deformation or disconnection of the wire occurs, or that the irregular shape of the sealing body formed in the resin sealing step is caused. As described up to this point, when looseness occurs in fixing between the chip mounting portion TAB and the suspension lead HL, deformation of the lead frame accordingly becomes more likely to be caused. As a result, the problems represented by the deterioration of the compression bonding characteristics of the wire and the irregular shape of the sealing body become noticeable. As a result, with the fixed structure by related-art embossing, the reduction of the reliability of the semiconductor device is caused.

Under such circumstances, in the present embodiment, there is devised a scheme capable of preventing the occurrence of looseness in fixing between the chip mounting portion TAB and the suspension lead HL. Below, the technical idea in the present invention to which the scheme is applied will be described by reference to the accompanying drawings.

<Configuration of Package (Semiconductor Device) in Embodiment>

Figure 7:
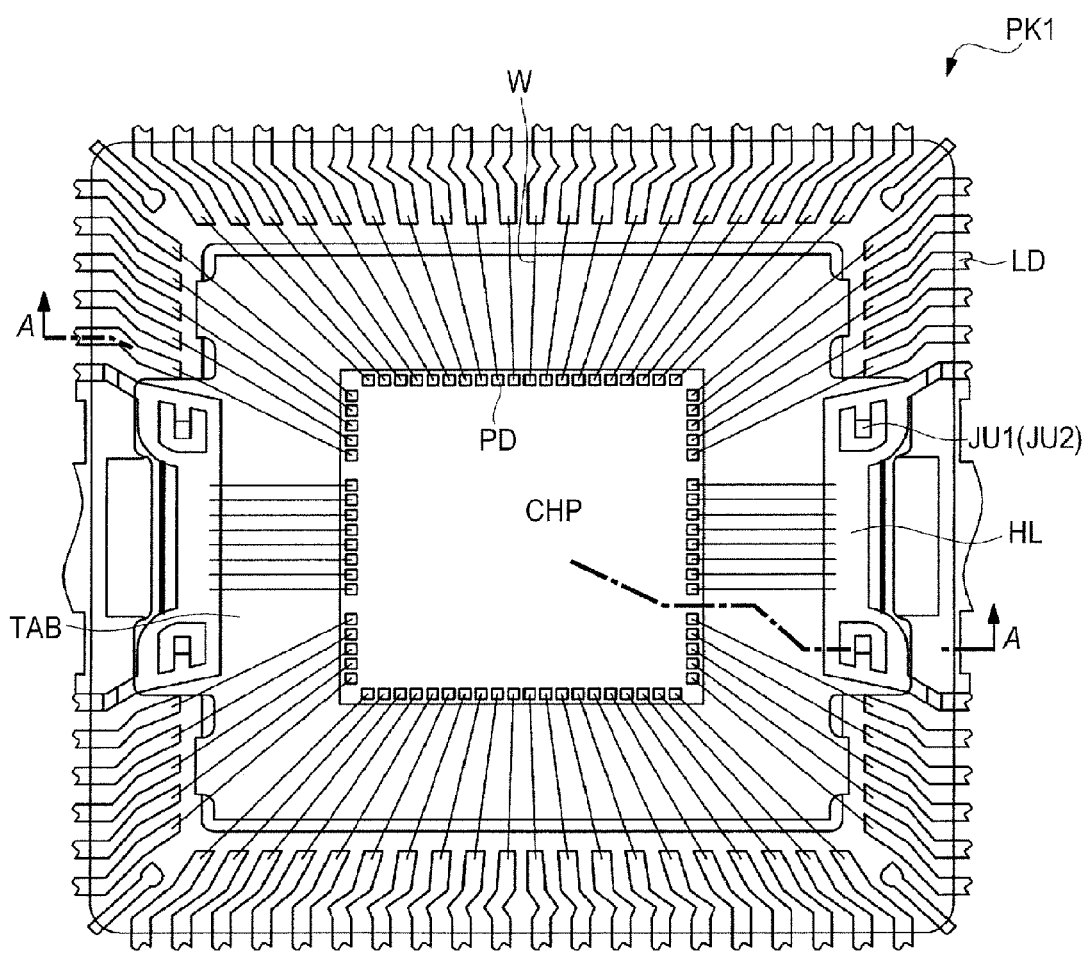
FIG. 7 is a view showing a configuration of a semiconductor device in an embodiment of the present invention.

FIG. 7 is a view showing a configuration of a semiconductor device PK1 in the present embodiment. In FIG. 7, the constituent elements of the semiconductor device PK1 are sealed by a sealing body formed of, for example, a resin. However, FIG. 7 shows the sealing body as seen therethrough in order to illustrate the constituent elements inside the sealing body.

First, as shown in FIG. 7, at the central part of the semiconductor device PK1 in the present embodiment, there is disposed a chip mounting portion (die pad) TAB in a generally rectangular shape. Over the top surface of the chip mounting portion TAB, there is mounted a semiconductor chip CHP in the shape of a rectangle smaller in area than the chip mounting portion TAB in plan view. In other words, the semiconductor chip CHP is disposed over the top surface of the chip mounting portion TAB so that the chip mounting portion TAB includes the semiconductor chip CHP therein in plan view. Herein, the chip mounting portion TAB is also called variously header or tab. For this reason, in the present specification, the chip mounting portion TAB, the header, and the tab are used as words having the same meaning.

An integrated circuit is formed in the foregoing semiconductor chip CHP. Specifically, at a semiconductor substrate forming the semiconductor chip CHP, there are formed semiconductor elements such as a plurality of MOSFETs. Then, in layers overlying the semiconductor substrate, a multilayer wiring is formed via interlayer insulation films. The multilayer wiring is electrically coupled with a plurality of MOSFETs formed over the semiconductor substrate to form an integrated circuit. In other words, the semiconductor chip CHP has a semiconductor substrate including a plurality of MOSFETs formed thereover, and the multilayer wiring formed over the semiconductor substrate. Thus, in the semiconductor chip CHP, a plurality of the MOSFETs and the multilayer wiring form an integrated circuit. In order to establish an interface between the integrated circuit and an external circuit, pads PD are formed over the semiconductor chip CHP. The pads PD are each formed by exposing a part of the uppermost layer wiring formed at the uppermost layer of the multilayer wiring. Then, a plurality of pads PD are disposed along the outer edge part of the semiconductor chip CHP. This results in that the semiconductor elements formed over the semiconductor chip CHP are electrically coupled with the pads PD via the multilayer wiring. In other words, the semiconductor elements and the multilayer wiring formed over the semiconductor chip CHP form an integrated circuit. The one functioning as a terminal for coupling the integrated circuit and the outside of the semiconductor chip CHP is the pad PD.

Then, around the chip mounting portion TAB, there are disposed a plurality of leads LD and suspension leads HL. Then, each pad PD is coupled with each lead LD by a wire W formed of, for example, a metal wire. This indicates the following: the integrated circuit formed over the semiconductor chip CHP can be electrically coupled with the outside of the semiconductor device PK1 (package) through the path of from the pads PD through the wires W, and the leads LD to an external coupling device. In other words, it is indicated as follows: by inputting electric signals from the leads LD formed over the semiconductor device PK1, it is possible to control the integrated circuit formed over the semiconductor chip CHP. Further, it is indicated as follows: it is also possible to extract output signals from the integrated circuit through the leads LD to the outside. Then, in the present embodiment, the chip mounting portion TAB and the suspension leads HL are physically fixed. The present embodiment is characterized in the structure in which the chip mounting portion TAB and the suspension lead HL are physically fixed. Specifically, first junction portions JU1 formed at the chip mounting portion TAB, and second junction portions JU2 formed at the suspension lead physically fix the chip mounting portion TAB and the suspension leads HL.

Figure 8:
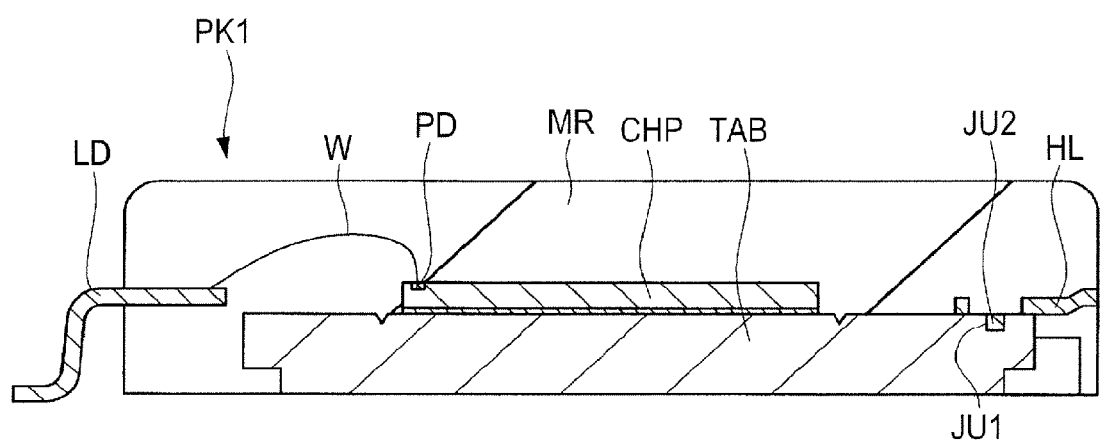
FIG. 8 is a cross-sectional view cut along line A-A of FIG. 7.

Subsequently, a description will be given to the cross-sectional structure of the semiconductor device PK1. FIG. 8 is a cross-sectional view cut along line A-A of FIG. 7. As shown in FIG. 8, over the chip mounting portion TAB, a semiconductor chip CHP is mounted via, for example, solder. Thus, each pad PD formed at the semiconductor chip CHP and each lead LD in the gull-wing shape disposed around the chip disposed mounting part TAB (e.g., on the left side of the chip mounting portion TAB shown in FIG. 8) are electrically coupled with each other by each wire W. On the other hand, in FIG. 8, on the right side of the chip mounting portion TAB, there is disposed each suspension lead HL. The suspension lead HL and the chip mounting portion TAB are physically fixed with each other. Then, the top surface of the chip mounting portion TAB, the semiconductor chip CHP, each wire W, a part of each lead LD, each suspension lead HL, each first junction portion JU1, and second junction portion JU2 are sealed by the sealing body MR. Incidentally, as apparent from FIG. 8, the thickness of the chip mounting portion TAB is sufficiently larger than the thickness of the lead LD and the thickness of the suspension lead HL. This results in a large heat capacity of the chip mounting portion TAB. Whereas, the back surface (bottom surface) of the chip mounting portion TAB is exposed from the sealing body MR. Accordingly, the heat generated at the semiconductor chip CHP is efficiently dissipated from the chip mounting portion TAB to outside the semiconductor device PK1. Incidentally, the back surface (bottom surface) of the chip mounting portion TAB is the surface to be soldered (which can be soldered) to the corresponding pattern of the mounting substrate when the semiconductor device PK1 is mounted on a mounting substrate.

The chip mounting portion TAB, the lead LD, and the suspension lead HL are each formed of, for example, a copper material or 42 alloy which is an alloy of iron and nickel. The wire W is formed of, for example, gold (Au), copper (Cu), and aluminum (Al). Whereas, the semiconductor chip CHP is formed of, for example, silicon or a compound semiconductor (such as GaAs).

Herein, a feature of the present embodiment resides in that, as shown in FIG. 8, into the first junction portion JU1 formed at the chip mounting portion TAB, there is fitted the second junction portion JU2 formed at the suspension lead HL, thereby to physically fix the chip mounting portion TAB and the suspension lead HL. Specifically, the first junction portion JU1 is formed of the concave part disposed in the surface of the chip mounting portion TAB. The second junction portion JU2 forms a part of the suspension lead HL. Then, into the first junction portion JU1 in a concave shape, there is inserted the second junction portion JU2 integral with the suspension lead HL, thereby to physically fix the chip mounting portion TAB and the suspension lead HL. As a result, in accordance with the present embodiment, it is possible to improve the coupling reliability of the chip mounting portion TAB and the suspension lead HL. In consequence, it is possible to improve the reliability of the semiconductor device PK1.

For example, as with the related-art technology shown in FIG. 4, the embossed part EB subjected to embossing is inserted into the opening OP. Then, the top of the embossed part EB is crushed, thereby to physically fix the chip mounting portion TAB and the suspension lead HL. In this case, it is necessary for the diameter of the opening OP to have a margin. Accordingly, looseness becomes more likely to occur. In contrast, in the present embodiment, for example, as shown in FIG. 8, into the first junction portion JU1 in a concave shape, there is fitted the second junction portion JU2 forming a part of the suspension lead HL, thereby to physically fix the chip mounting portion TAB and the suspension lead HL. For this reason, there is no gap between the first junction portion JU1 and the second junction portion JU2. In other words, the gap which becomes a cause for the occurrence of looseness is not present between the first junction portion JU1 and the second junction portion JU2. Accordingly, it is possible to surely fix the chip mounting portion TAB and the suspension lead HL.

Further, for example, in accordance with the related-art technology shown in FIG. 4, in the region of the bottom surface of the chip mounting portion TAB corresponding to the embossed part EB of the bottom surface of the chip mounting portion TAB, there is formed a dent by embossing. Accordingly, even when the chip mounting portion TAB itself is fixed, the bottom surface corresponding to the embossed part EB is raised. As a result of this, the top surface of the embossed part EB cannot be crushed with the bottom surface corresponding to the embossed part EB firmly fixed. This results in a higher possibility that fixing is achieved with the embossed part EB shifted, for example, as shown in FIG. 6. In contrast, in the present embodiment, in the top surface of the chip mounting portion TAB, there is formed the first junction portion JU1 formed of a concave part. Into the first junction portion JU1, there is fitted the second junction portion JU2 which is a part of the suspension lead HL. In this case, for example, the first junction portion JU1 formed of a concave part formed in the chip mounting portion TAB is formed by subjecting the top surface of the chip mounting portion TAB to press working. In other words, in the present embodiment, the embossed part EB projecting from the chip mounting portion TAB is not formed by subjecting the chip mounting portion TAB to embossing as with the related-art technology shown in FIG. 4. Accordingly, in the present embodiment, the region of the bottom surface of the chip mounting portion TAB opposite to the junction region between the first junction portion JU1 and the second junction portion JU2 of the bottom surface of the chip mounting portion TAB includes no dent present therein, and remains flat. Therefore, when into the first junction portion JU1 formed of a concave part, the second junction portion JU2 formed of a part of the suspension lead HL is fitted, the bottom surface region of the chip mounting portion TAB opposite to the first junction portion JU1 can be rendered in a firmly pressed state. For this reason, it is possible to surely fit the second junction portion JU2 into the first junction portion JU1.

As described up to this point, the present embodiment has a first feature that by fitting the second junction portion JU2 forming a part of the suspension lead HL into the first junction portion JU1 in a concave shape, the chip mounting portion TAB and the suspension lead HL are physically fixed. Further, the present embodiment has a second feature as follows: the bottom surface region of the chip mounting portion TAB opposite to the first junction portion JU1 can be kept flat; accordingly, with the bottom surface region firmly pressed, the second junction portion JU2 formed of a part of the suspension lead HL can be fitted into the first junction portion JU1 formed of a concave part. Thus, the present embodiment has the foregoing first feature and second feature. As a result, it is possible to improve the coupling reliability of the chip mounting portion TAB and the suspension lead HL.

Incidentally, the width of the second junction portion JU2 forming a part of the suspension lead HL may be equal to, or may be different from each width of other portions of the suspension lead HL. However, from the viewpoint of improving the coupling strength between the first junction portion JU1 formed of a concave part (groove part) and the second junction portion JU2, the width of the second junction portion JU2 forming a part of the suspension lead HL is desirably larger than each width of other portions of the suspension lead HL. The reason is as follows: in this case, the contact area between the first junction portion JU1 and the second junction portion JU2 becomes large, which can improve the junction strength between the first junction portion JU1 and the second junction portion JU2.

<Configuration of Lead Frame in Embodiment>

Figure 9:
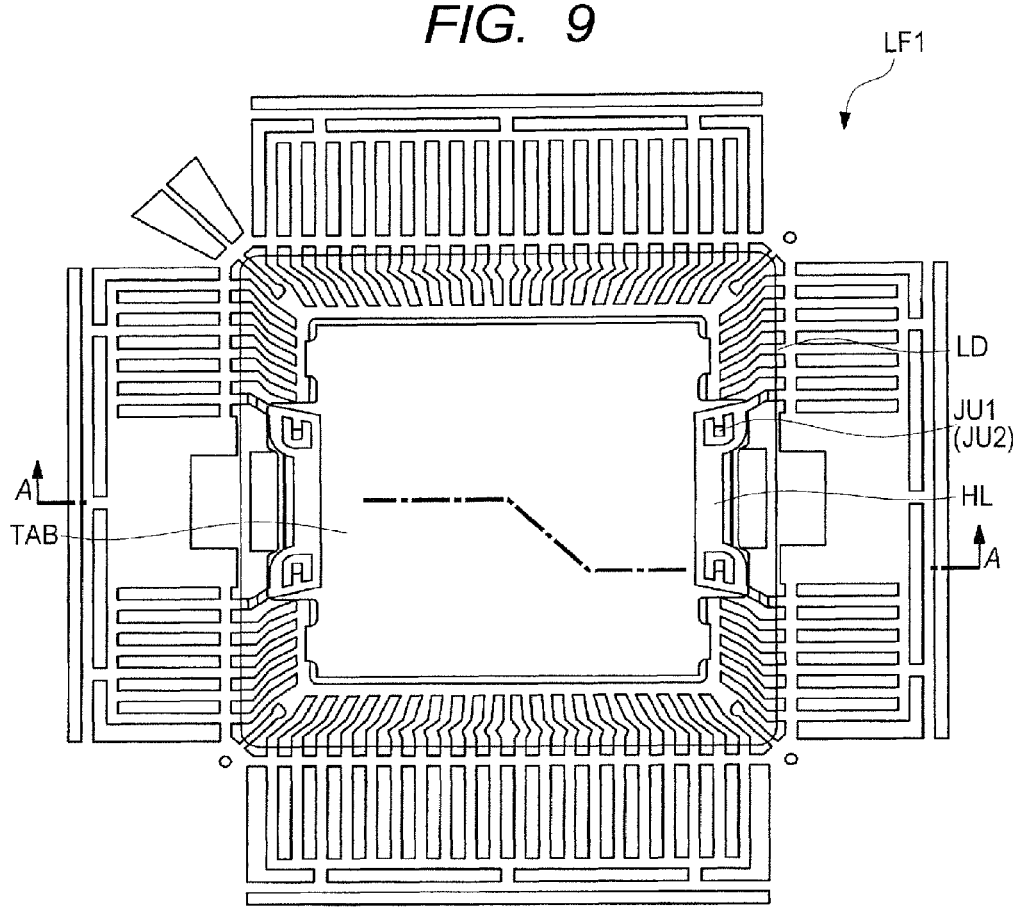
FIG. 9 is a plan view showing a configuration of a lead frame for use in manufacturing a semiconductor device of an embodiment.
Figure 10:
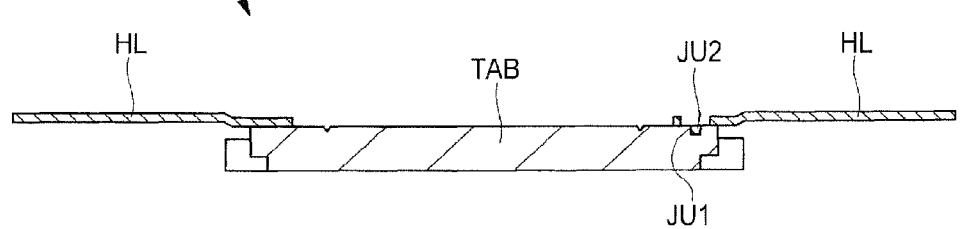
FIG. 10 is a cross-sectional view cut along line A-A of FIG. 9.
Figure 11:
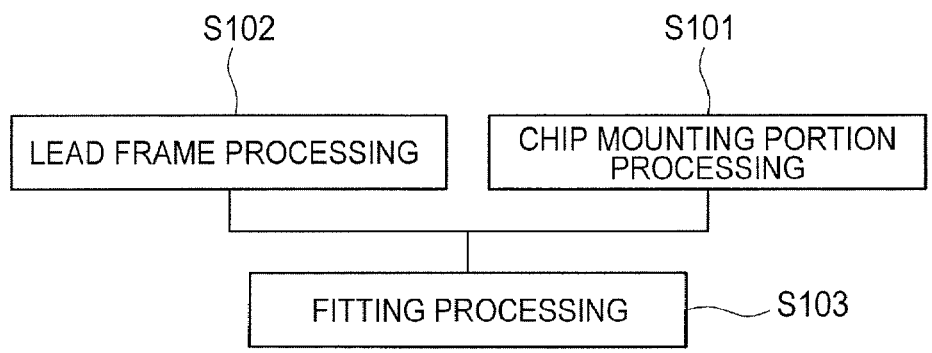
FIG. 11 is a flowchart showing the flow of steps of fixing a chip mounting portion to a lead frame.

The semiconductor device PK1 in the present embodiment is configured as described above. Below, further, a description will be given to the configuration of a lead frame LF1 for use in the manufacturing steps of the semiconductor device PK1. FIG. 9 is a plan view showing the configuration of a lead frame LF1 for use in manufacturing the semiconductor device PK1 of the present embodiment. FIG. 10 is a cross-sectional view cut along line A-A of FIG. 9. Whereas, FIG. 11 is a flowchart showing the flow of steps of fixing the chip mounting portion to the lead frame. As shown in FIG. 9, in the lead frame LF1 of the present embodiment, at the central part, there is disposed the chip mounting portion TAB formed as a separate body. Around the chip mounting portion TAB, there are disposed a plurality of leads LD and suspension leads HL. The plurality of the leads LD and the suspension leads HL are coupled with each other by a tie bar. The tie bar can prevent the resin from leaking through the gap between the plurality of leads LD when resin sealing is performed. Then, each suspension lead HL forming a part of the lead frame LFP and the chip mounting portion TAB are fixed with each other by fitting the second junction portion JU2 formed integral with the suspension lead HL into the first junction portion JU1 formed of a concave part formed in the chip mounting portion TAB. Specifically, as shown in FIG. 10, some region of the chip mounting portion TAB is subjected to press working or etching processing, thereby to form the first junction portion JU1 formed of a concave part in the top surface (front surface) of the chip mounting portion TAB (S101 of FIG. 11). Then, at a part of the suspension lead HL disposed at a position corresponding to the position at which the first junction portion JU1 is formed, there is disposed the second junction portions JU2 is disposed by, for example, bending processing (S102 of FIG. 11). Then, with the bottom surface of the chip mounting portion TAB including the first junction portion JU1 formed therein being pressed (supported), the second junction portion JU2 is fitted into the first junction portion JU1 (S103 of FIG. 11). As a result, with the second junction portion JU2 fitted into the first junction portion JU1, the chip mounting portion TAB can be fixed to the suspension lead HL of the lead frame LF1. Thus, in the present embodiment, it is indicated as follows: into the first junction portion JU1 formed in the chip mounting portion TAB, the second junction portion JU2 forming apart of the suspension lead HL is fitted; as a result, it is possible to physically fix the chip mounting portion TAB and the suspension lead HL separated as different bodies from each other.

In the above explanation, a description was given to the following: into the first junction portion JU1 formed of a concave part, there is fitted the second junction portion JU2 forming a part of the suspension lead HL; as a result, the chip mounting portion TAB is fixed to the suspension lead HL. However, particularly, the fixed structure in which the second junction portion JU2 is fitted into the first junction portion JU1 has various variations. Below, such fixed structure having various variations will be described by reference to the accompanying drawings.

<First Fixed Structure>

Figure 12:
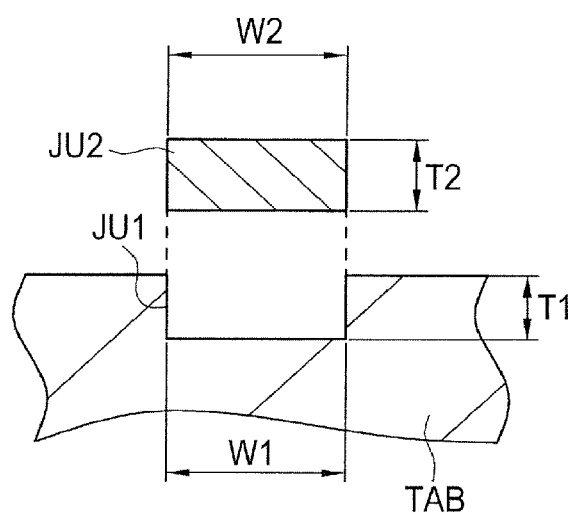
FIG. 12 is a view showing a region in the vicinity of a first junction portion formed of a concave part of the chip mounting portion on an enlarged scale.

FIG. 12 is an enlarged view of the region in the vicinity of the first junction portion JU1 formed of a concave part of the chip mounting portion TAB. Above the first junction portion JU1, there is shown the cross section of the second junction portion JU2 integral with the suspension lead. In FIG. 12, the depth of the first junction portion JU1 is referred to as T1, and the width of the first junction portion JU1 is referred to as W1. On the other hand, the thickness of the second junction portions JU2 is referred to as T2, and the width of the second junction portion JU2 is referred to as W2. At this step, the width W1 of the first junction portion JU1 is equal to, or larger than the width W2 of the second junction portion JU2 (width W1≥width W2). Specifically, for example, width W1=width W2+10 μm to 20 μm. Whereas, the width W2 of the second junction portion JU2 is equal to, or larger than the thickness T2 of the second junction portion JU2 (width W2≥thickness T2). Further, the thickness T2 of the second junction portion JU2 is, for example, 0.1 mm to 0.25 mm.

Figure 13A:
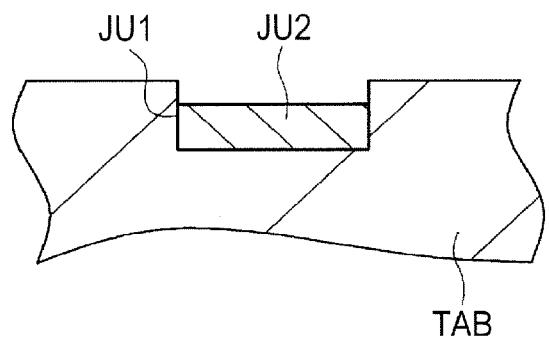
FIGS. 13A to 13C are each a view showing a process of manufacturing a first fixed structure.
Figure 13B:
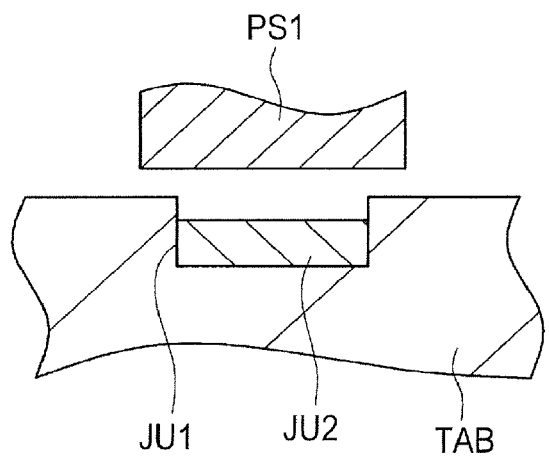
Figure 13C:
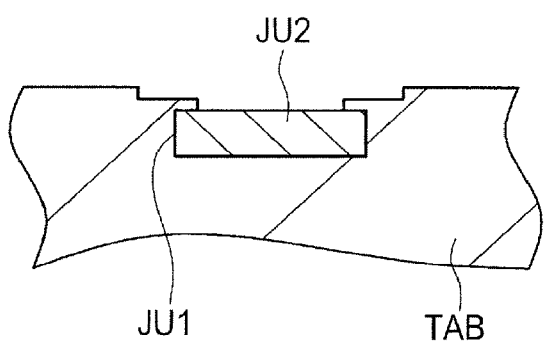

Based on such premise, first, the first fixed structure will be described. FIGS. 13A to 13C are each a view showing a process of manufacturing the first fixed structure. The first fixed structure is a structure based on the premise that the thickness T2 of the second junction portion JU2 is smaller than the depth T1 of the first junction portion JU1. First, as shown in FIG. 13A, the second junction portion JU2 is fitted into the first junction portion JU1 formed of a concave part. At this step, the thickness T2 of the second junction portion JU2 is smaller than the depth T1 of the first junction portion JU1. For this reason, fitting is achieved so that the whole second junction portion JU2 is embedded in the first junction portion JU1, and so that the surface of the second junction portion JU2 is lower than the top surface of the chip mounting portion TAB.

Subsequently, as shown in FIG. 13B, a large punch PS1 is pressed against the chip mounting portion TAB including the second junction portion JU2 fitted therein while applying a pressure thereto. At this step, one end of the large punch PS1 is disposed on the outer side of the end of the first junction portion JU1 by about 20 μm to 30 μm. In other words, the contact area of the large punch PS1 internally includes the first junction portion JU1, and includes even the outside region of the first junction portion JU1.

As a result, as shown in FIG. 13C, the top surface of the chip mounting portion TAB present in the outside region of the first junction portion JU1 is compressed. As a result, the second junction portion JU2 is compression-bonded to the first junction portion JU1. In other words, fixing between the chip mounting portion TAB and the suspension lead HL is performed by inserting the second junction portion JU2 into the first junction portion JU1, and compression-bonding them. Namely, compression bonding using the large punch PS1 crushes the end of the first junction portion JU1. As a result, as shown in FIG. 13C, the end of the second junction portion JU2 is covered with the end of the first junction portion JU1. In other words, it results that the area of the surface region of the second junction portion JU2 exposed from the first junction portion JU1 is smaller than the area of the bottom surface of the first junction portion JU1 (the bottom surface of the concave part). Thus, the first fixed structure is formed. With the first fixed structure, the second junction portion JU2 is surely compression-bonded to the first junction portion JU1. For this reason, it is possible to improve the coupling reliability between the chip mounting portion TAB and the suspension lead. Particularly, with the first fixed structure, the end of the second junction portion JU2 is covered with the end of the first junction portion JU1. This can reduce the potential that the second junction portion JU2 comes out of the first junction portion JU1 after compression bonding. Further, the first fixed structure can be formed by the compression bonding step by the large punch PS1, and an adhesive member or the like is not used. As a result, the following advantages can be obtained: the step can be simplified; and an unnecessary cost increase can be suppressed.

<Second Fixed Structure>

Figure 14A:
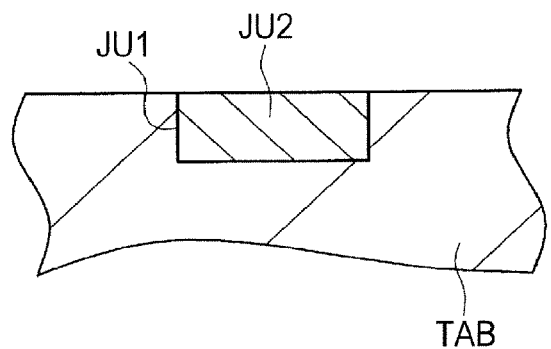
FIGS. 14A to 14C are each a view showing a process of manufacturing a second fixed structure.
Figure 14B:
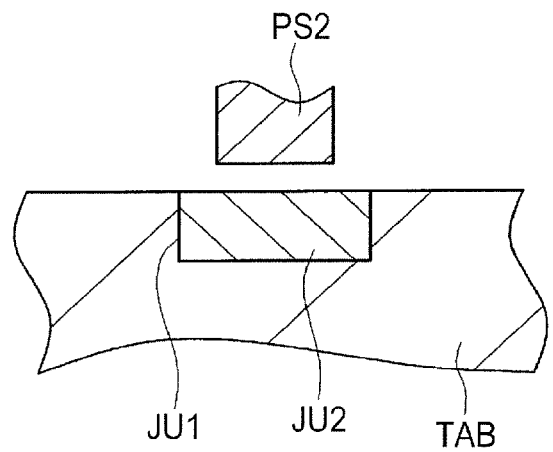
Figure 14C:
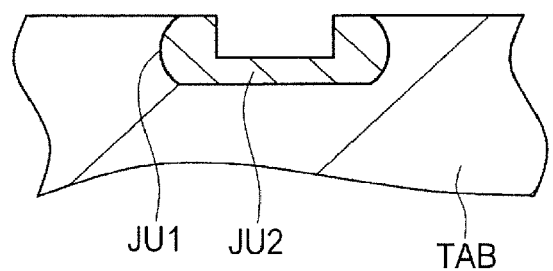

Subsequently, the second fixed structure will be described. FIGS. 14A to 14C are each a view showing a process of manufacturing the second fixed structure. At this step, in the second fixed structure, the depth of the first junction portion JU1 is referred to as T1, and the width of the first junction portion JU1 is referred to as W1. On the other hand, the thickness of the second junction portion JU2 is referred to as T2, and the width of the second junction portion JU2 is referred to as W2. Herein, the width W1 of the first junction portion JU1 is equal to, or larger than the width W2 of the second junction portion JU2 (width W1 width W2). Further, the second fixed structure is a structure based on the premise that the depth T1 of the first junction portion JU1 is roughly equal to the thickness T2 of the second junction portion JU2.

First, as shown in FIG. 14A, the second junction portion JU2 is fitted into the first junction portion JU1 formed of a concave part. At this step, the depth T1 of the first junction portion JU1 is roughly equal to the thickness T2 of the second junction portion JU2. Accordingly, fitting is achieved so that the whole second junction portion JU2 is embedded in the first junction portion JU1, and so that the height of the surface of the second junction portion JU2 and the height of the top surface of the chip mounting portion TAB are roughly flush with each other.

Then, as shown in FIG. 14B, a small punch PS2 is pressed against a part of the surface of the second junction portion JU2 fitted in the first junction portion JU1 while applying a pressure thereto. At this step, one end of the small punch PS2 is disposed inwardly of the end of the first junction portion JU1 by about 10 μm. In other words, the contact area of the small punch PS2 is internally included in the surface of the second junction portion JU2.

As a result, as shown in FIG. 14C, apart of the top surface of the inside region of the second junction portion JU2 is compressed. As a result, the second junction portion JU2 is compression-bonded to the first junction portion JU1. In other words, fixing between the chip mounting portion TAB and the suspension lead HL is performed by inserting the second junction portion JU2 into the first junction portion JU1, and compression-bonding them. Namely, the second junction portions JU2 is fitted into the first junction portion JU1 so that there are some widths between the side surfaces of the concave part forming the first junction portion JU1 which are larger than the width of the bottom surface of the concave part. As a result of this, the compression-bonded second junction portion JU2 can be firmly fixed to the first junction portion JU1 without readily coming out of the first junction portion JU1. In other words, it results that a concave part is formed in the top surface of the second junction portion JU2. Then, the height of the concave part is lower than the height of the top surface of the first junction portion JU1 (the top surface of the chip mounting portion TAB). Thus, the second fixed structure is formed. With the second fixed structure, the second junction portion JU2 is surely compression-bonded to the first junction portion JU1. Accordingly, it is possible to improve the coupling reliability between the chip mounting portion TAB and the suspension lead HL. Particularly, with the second fixed structure, the distance between the side surfaces of the concave part forming the first junction portion JU1 is larger than the width of the bottom surface of the concave part. This can reduce the potential that the second junction portion JU2 comes out of the first junction portion JU1 after compression bonding. Further, the second fixed structure can be formed by the compression bonding step by the small punch PS2, and an adhesive member or the like is not used. As a result, the following advantages can be obtained: the step can be simplified; and an unnecessary cost increase can be suppressed.

<Third Fixed Structure>

Figure 15A:
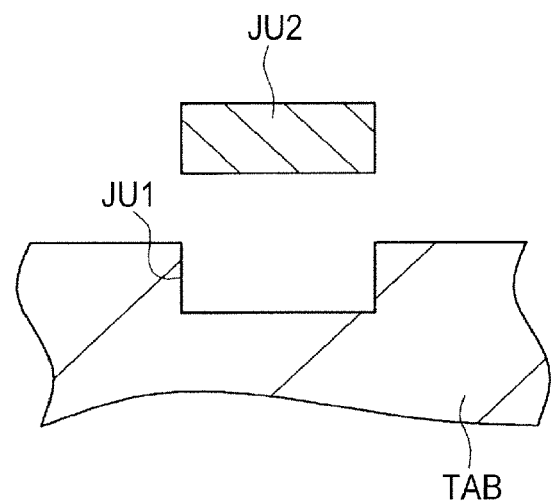
FIGS. 15A to 15B are each a view showing a process of manufacturing a third fixed structure.
Figure 15B:
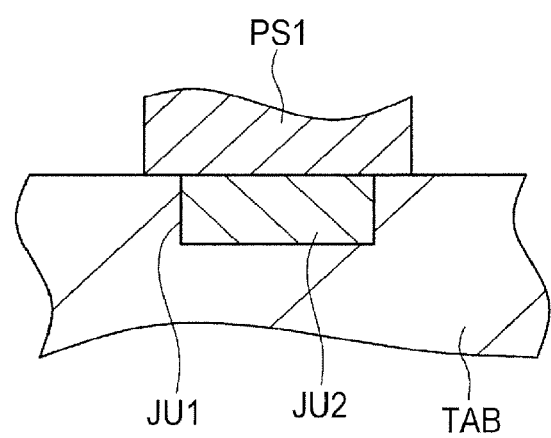

Then, a third fixed structure will be described. FIGS. 15A and 15B are each a view showing a process of manufacturing the third fixed structure. The third fixed structure is a structure based on the premise that the depth T1 of the first junction portion JU1 is roughly equal to the thickness T2 of the second junction portion JU2. Further, in the third fixed structure, the width of the concave part forming the first junction portion JU1 is roughly equal to the width of the second junction portion JU2.

First, as shown in FIG. 15A, a preparation is performed to fit the second junction portion JU2 into the first junction portion JU1 formed of a concave part. Then, as shown in FIG. 15B, for example, the large punch PS1 is prepared. At this step, the area of the bottom surface of the large punch PS1 has a size enough to internally include the first junction portion JU1, and to include even the outside region of the first junction portion JU1. Then, by using the large punch PS1, into the concave part forming the first junction portion JU1, there is fitted the second junction portion JU2. At this step, the depth T1 of the first junction portion JU1 and the thickness T2 of the second junction portion JU2 is roughly equal to each other. For this reason, fitting is achieved so that the whole second junction portion JU2 is embedded in the first junction portion JU1, and so that the height of the surface of the second junction portion JU2 and the height of the top surface of the chip mounting portion TAB are roughly flush with each other. Further, with the third fixed structure, the width of the concave part forming the first junction portion JU1 and the width of the second junction portion JU2 are roughly equal to each other. For this reason, the second junction portion JU2 is firmly fitted into the first junction portion JU1. In other words, the width of the concave part forming the first junction portion JU1 and the width of the second junction portion JU2 are roughly equal to each other. For this reason, the second junction portion JU2 becomes less likely to be fitted into the inside of the concave part. However, this results in that once the second junction portion JU2 is fitted into the first junction portion JU1, the second junction portion JU2 becomes less likely to come out of the first junction portion JU1.

Herein, with the third fixed structure, the width of the concave part forming the first junction portion JU1 and the width of the second junction portion JU2 are roughly equal to each other. This configuration is intended for the following: when the second junction portion JU2 is fitted into the first junction portion JU1, the second junction portion JU2 is firmly fixed to the first junction portion JU1.

Incidentally, with the third fixed structure, it may also be configured such that width W1<width W2, where W1 denotes the width of the first junction portion JU1, and W2 denotes the width of the second junction portion JU2. In this case, the width W1 of the concave part forming the first junction portion JU1 is smaller than the width W2 of the second junction portion JU2. For this reason, the second junction portion JU2 becomes less likely to be fitted into the inside of the concave part. However, this results in that once the second junction portion JU2 is fitted into the first junction portion JU1, the second junction portion JU2 becomes less likely to come out of the first junction portion JU1. In other words, when it is configured such that width W1<width W2, it is possible to obtain a more firm fixing force.

With such a third fixed structure, fixing can be achieved only by inserting the second junction portion JU2 into the first junction portion JU1; and an adhesive member is not used. As a result, the following advantages can be obtained: the step can be simplified; and an unnecessary cost increase can be suppressed.

<Fourth Fixed Structure>

Figure 16A:
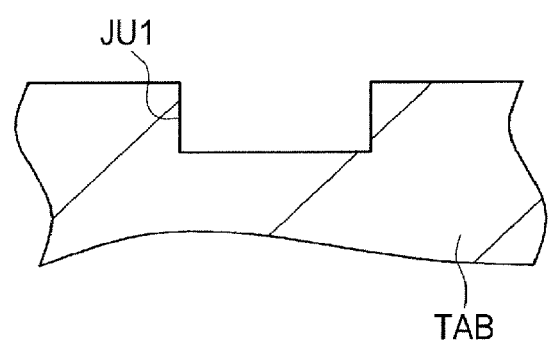
FIGS. 16A to 16C are each a view showing a process of manufacturing a fourth fixed structure.
Figure 16B:
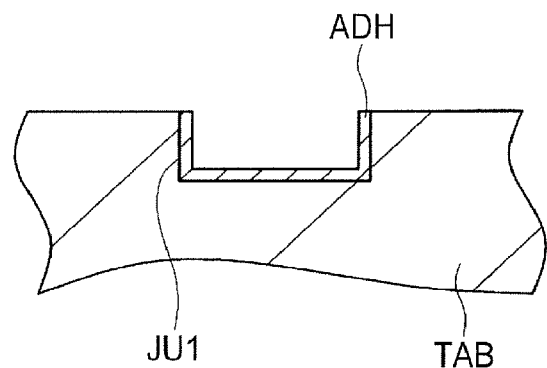
Figure 16C:
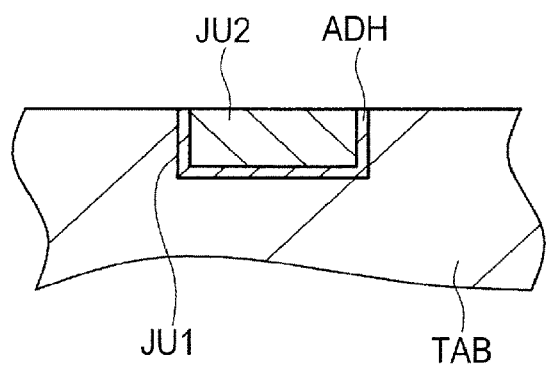

Subsequently, a fourth fixed structure will be described. FIGS. 16A to 16C are each a view showing a process for manufacturing the fourth fixed structure. The fourth fixed structure is a structure based on the premise that the width W2 of the second junction portion JU2 is smaller than the width W1 of the first junction portion JU1.

First, for example, as shown in FIG. 16A, the first junction portion JU1 formed of a concave part formed by press working or etching processing is formed in the chip mounting portion TAB. Then, as shown in FIG. 16B, onto the inner wall of the concave part, there is coated an adhesive member ADH formed of, for example, solder or an adhesive material. Then, as shown in FIG. 16C, into the adhesive member ADH-coated concave part, there is fitted the second junction portion JU2. As a result, the adhesive member ADH is interposed between the first junction portion JU1 and the second junction portion JU2. This results in that the second junction portion JU2 is surely fixed to the first junction portion JU1 by the adhesive member ADH. In other words, with the fourth fixed structure, the first junction portion JU1 and the second junction portion JU2 are bonded to each other by the adhesive member ADH. Accordingly, it is possible to improve the adhesion strength between the first junction portion JU1 and the second junction portion JU2. As a result of this, with the fourth fixed structure, it is possible to improve the coupling reliability between the first junction portion JU1 and the second junction portion JU2. This can implement a sure fixing between the chip mounting portion TAB and the suspension lead.

<Essence (Feature) Common to First Fixed Structure to Fourth Fixed Structure>

As described above, in the present embodiment, as the technologies of fixing the chip mounting portion TAB and the suspension lead HL which are formed of mutually separate bodies, for example, mention may be made of the first fixed structure to the fourth fixed structure. The essence (feature) common to the first fixed structure to the fourth fixed structure resides in the following: into the first junction portion JU1 formed of a concave part, there is fitted the second junction portion JU2 forming a part of the suspension lead HL, thereby to fix the chip mounting portion TAB to the suspension lead HL.

Then, in the first fixed structure to the fourth fixed structure, there is the foregoing common feature. For this reason, the feature point can provide the following remarkable effect: when the second junction portion JU2 is fixed to the first junction portion JU1, finally, there is no gap between the first junction portion JU1 and the second junction portion JU2; this can surely fix the chip mounting portion TAB and the suspension lead HL.

In other words, in the related-art technology, the following configuration is adopted: by embossing, a convex part is formed in the chip mounting portion TAB; the convex part is inserted into the opening OP formed in the suspension lead HL. In this case, the margin of the opening OP formed allowing for the variations in shape of the convex part remains even after the final form in which the top of the convex part is crushed and fixed. Accordingly, the looseness caused by the margin becomes remarkable as a problem.

In contrast, in the technical idea in the present first embodiment, by press working or etching processing, a concave part is formed in the chip mounting portion TAB. Into the concave part, there is fitted a part of the suspension lead HL. In this case, for example, as apparent from the first fixed structure to the fourth fixed structure, in the final fixed state after fitting the second junction portion JU2 into the first junction portion JU1, there is no gap between the first junction portion JU1 and the second junction portion JU2. As a result of this, in the present first embodiment, looseness is less likely to occur at the fixing part between the first junction portion JU1 and the second junction portion JU2. This can surely fix the chip mounting portion TAB and the suspension lead HL.

Thus, the technical idea in the present first embodiment, and the related-art technology are totally opposite to each other in structure for fixing the chip mounting portion TAB and the suspension lead HL. Sure fixing between the chip mounting portion TAB and the suspension lead HL can be implemented only by the configuration in which a concave part is formed in the chip mounting portion TAB, and a part of the suspension lead LH is fitted into the concave part as in the present embodiment. In other words, the technical idea in the present first embodiment can provide a remarkable effect which is difficult to obtain with the related-art technology.

Herein, the wording "there is no gap" in the present specification is a concept as follows. Namely, the wording "there is no gap" used in the present specification is not limited to the case where there is no gap at all, but embraces even the case where it can be considered proper that there is substantially no gap. For example, the case where there is substantially no gap embraces the junction state in which the area of the portion at which the first junction portion JU1 and the second junction portion JU2 are in contact with each other (also including the case of close contact therebetween via an adhesive material) is larger than the area of the portion at which the first junction portion JU1 and the second junction portion JU2 are not in contact with each other. Further, for example, even when there is a portion at which the first junction portion JU1 and the second junction portion JU2 are microscopically not in contact with each other due to slight unevenness at respective surfaces thereof, this portion is not referred to as a "gap" in the present specification. Further, for example, at the corner portion of the first junction portion JU1, a part of the second junction portion JU2 cannot be fully deformed to form some gap. Even in this case, so long as other portions of the second junction portion JU2 are in contact with the first junction portion JU1, thereby to provide a junction force enough to solve the problem, this state is also referred to as the state in which there is substantially no gap.

<Manufacturing Method of Semiconductor Device in Embodiment>

The semiconductor device in the present embodiment is configured as described above. Below, the manufacturing method will be described.

First, there is prepared a semiconductor wafer in a generally disc shape in plan view. Then, over the semiconductor wafer, there are formed semiconductor elements. The step of forming the semiconductor elements is performed by using a manufacturing technology such as deposition technology, etching technology, heat treatment technology, ion implantation technology, or photolithography technology. For example, as semiconductor elements, mention may be made of MOSFETs (Metal Oxide Semiconductor Field Effect Transistors) formed over a silicon substrate, and bipolar transistors. Further, as the semiconductor elements, there are also formed passive elements represented by resistance element, capacitance element, or inductor element.

Subsequently, a wiring layer is formed over the semiconductor wafer including semiconductor elements formed therein. The wiring layer is formed by patterning a metal film formed over an interlayer insulation film. Generally, the wiring layer is often formed in a multilayer wiring structure, but may be formed in a monolayer wiring layer. The wire forming the wiring layer is formed of, for example, a wire using an aluminum film, or a wire using a copper film (damascene wire). Then, pads are formed at the uppermost layer of the wiring layer. In the foregoing manner, it is possible to obtain a semiconductor wafer subjected to the pre-step processing.

Figure 17:
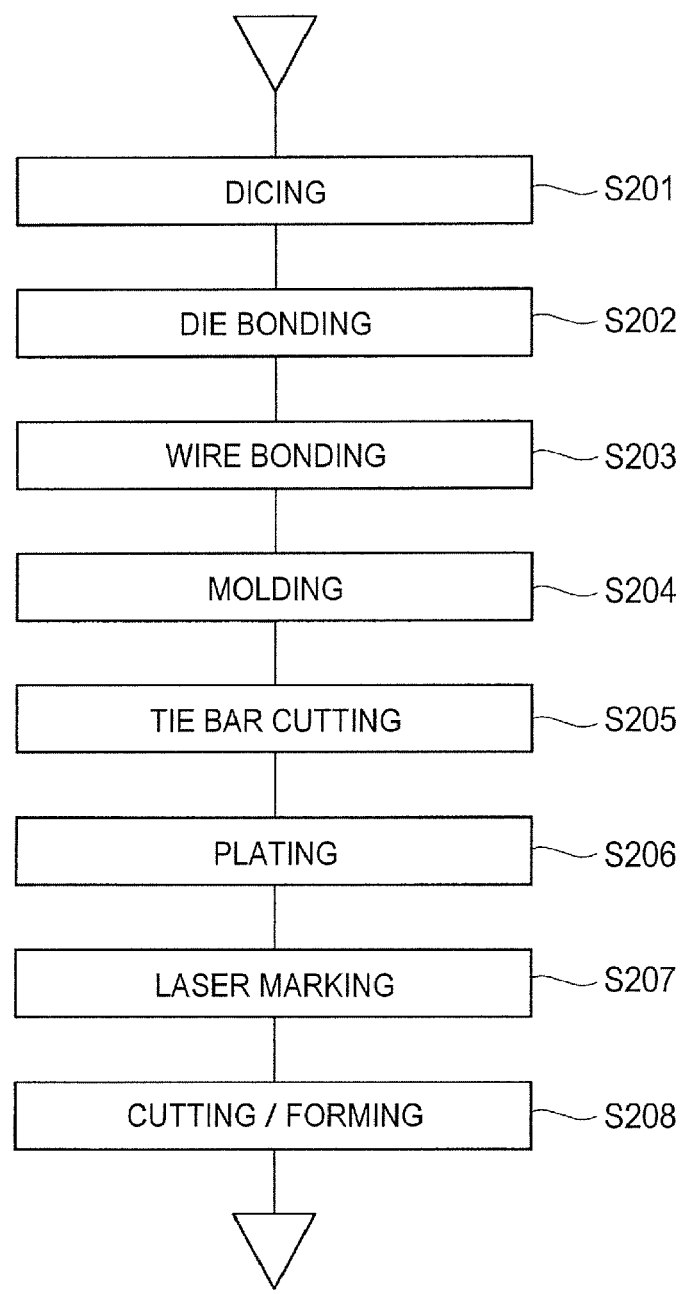
FIG. 17 is a flowchart showing the flow of post-step processings.

Then, the semiconductor wafer is subjected to a back grinding processing, thereby to reduce the thickness of the semiconductor wafer. Then, post-step processings are carried out. FIG. 17 is a flowchart showing the flow of the post-step processings. First, before carrying out the post-step processings, there is prepared a lead frame in the present embodiment. Specifically, by undergoing the steps as shown in FIG. 11, there is prepared a lead frame including the chip mounting portion fixed at the suspension lead. For example, some region of the chip mounting portion TAB is subjected to press working or etching processing, thereby to form the first junction portion formed of a concave part in the top surface (front surface) of the chip mounting portion (S101 of FIG. 11). Then, at a part of the suspension lead disposed at a position corresponding to the position at which the first junction portion is formed, there is disposed the second junction portion by, for example, bending processing (S102 of FIG. 11). Then, with the bottom surface of the chip mounting portion including the first junction portion formed therein being pressed, the second junction portion is fitted into the first junction portion (S103 of FIG. 11). As a result, with the second junction portion fitted into the first junction portion, the chip mounting portion can be fixed to the suspension lead of the lead frame. In this manner, it is possible to form the lead frame including the chip mounting portion fixed to the suspension lead.

Subsequently, the post-step processings are carried out. First, the semiconductor wafer including an integrated circuit formed therein is diced, thereby to cut respective chip regions formed in the semiconductor wafer, obtaining semiconductor chips (S201 of FIG. 17). Then, over the chip mounting portion fixed to the lead frame, the obtained semiconductor chip is mounted (S202 of FIG. 17). Then, each pad formed at the semiconductor chip and each lead formed at the lead frame are coupled with each other by a wire (S203 of FIG. 17). Then, the semiconductor chip, the wire, a part of the suspension lead, and a part of the lead are sealed by a resin (S204 of FIG. 17). Then, the tie bar formed at the lead frame is cut (S205 of FIG. 17). Then, over the surface of the lead exposed from the resin, there is formed a plating film (S206 of FIG. 17). Subsequently, on the surface of the resin, by using, for example, a laser light, a mark is formed (S207 of FIG. 17). Then, the lead protruding from the resin is formed (S208 of FIG. 17). In this manner, the semiconductor device (package) is formed. Then, an electrical characteristic test is carried out, so that semiconductor devices judged as good products are shipped as products. In the manner described up to this point, it is possible to manufacture a semiconductor device in the present embodiment.

As described up to this point, in accordance with the method for manufacturing the semiconductor device in the present embodiment, it is possible to use a lead frame with the chip mounting portion TAB surely fixed to the suspension lead HL. For this reason, it is possible to suppress the looseness caused between the chip mounting portion TAB and the suspension lead HL. This means that the lead frame LF becomes less likely to be deformed during the manufacturing steps of the semiconductor device. In other words, in accordance with the present embodiment, looseness is less likely to occur in fixing between the chip mounting portion TAB and the suspension lead HL. Accordingly, for example, in the wire bonding step, it is possible to suppress uneven pressing of the lead by the capillary. As a result, it is possible to surely perform transmission of an ultrasonic wave from the capillary to the lead. This can prevent poor compression bonding of the wire to the lead.

Further, in the resin sealing step, resin sealing is performed with the lead frame clamped by a metal mold. At this step, in the present invention, looseness becomes less likely to occur in fixing between the chip mounting portion TAB and the suspension lead HL. For this reason, it is possible to suppress the deformation of the lead frame occurring when the lead frame is clamped by a metal mold. Accordingly, in accordance with the present embodiment, the deformation of the lead frame becomes less likely to occur in the resin sealing step, which can reduce the load imposed on the wire for coupling the pad and the lead. As a result, in accordance with the present invention, it is possible to suppress the occurrence of disconnection of the wire, the irregular shape of the sealing body formed in the resin sealing step, and the like. As described up to this point, in the present embodiment, it is possible to surely perform fixing between the chip mounting portion TAB and the suspension lead HL. For this reason, it is possible to suppress the deformation of the lead frame. As a result, in accordance with the present embodiment, it is possible to prevent the deterioration of the compression bonding characteristics of the wire and the irregular shape of the sealing body caused by the deformation of the lead frame. Accordingly, is possible to improve the reliability of the semiconductor device.

First Modified Example

Then, a first modified example will be described. In the present first modified example, a description will be given to an example in which at each corner portion of the chip mounting portion TAB, there is disposed a coupling portion between the chip mounting portion TAB and the suspension lead HL.

Figure 18:
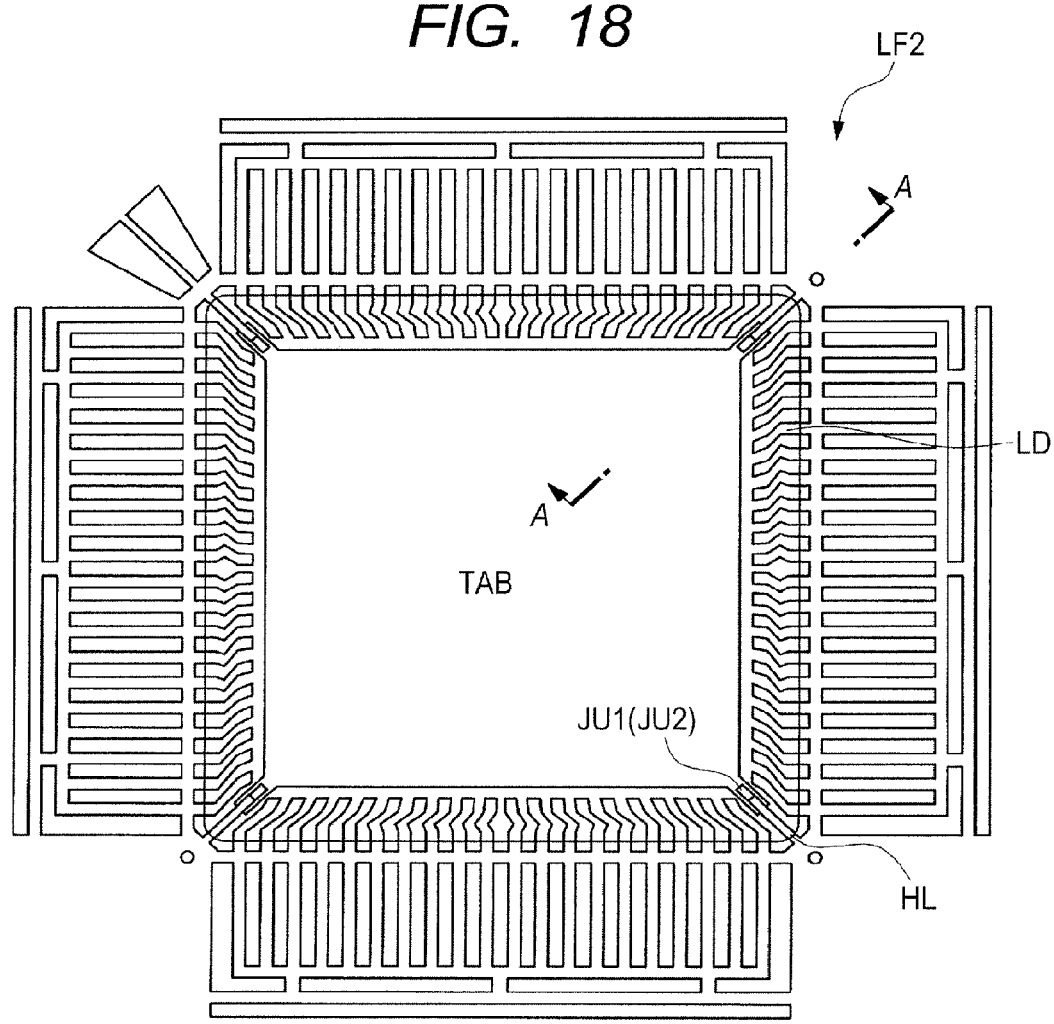
FIG. 18 is a view showing a configuration of a lead frame in a first modified example.
Figure 19:
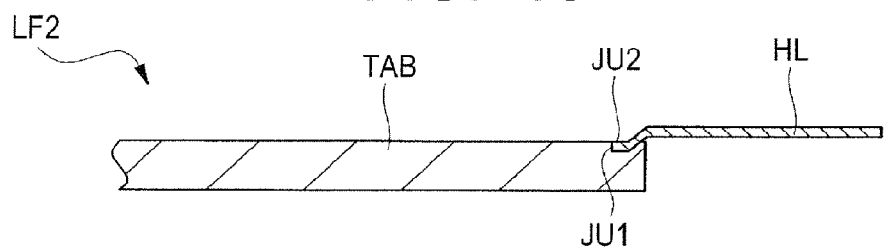
FIG. 19 is a cross-sectional view cut along line A-A of FIG. 18.

FIG. 18 is a view showing a configuration of a lead frame LF2 in the first modified example. As shown in FIG. 18, at the central part, there is disposed a chip mounting portion TAB in a rectangular shape. A plurality of leads LD are formed in such a manner as to surround the periphery of the chip mounting portion TAB. Then, a feature of the present first modified example resides in the following point: the suspension leads HL are disposed at the corner portions of the chip mounting portion TAB; and at the corner portions, the chip mounting portion TAB is fixed to the suspension leads HL. In other words, in the present first modified example, at each corner portion of the chip mounting portion TAB, to each first junction portion JU1 formed in the chip mounting portion TAB, there is fixed each second junction portion JU2 forming a part of the suspension lead HL. FIG. 19 is a cross-sectional view cut along line A-A of FIG. 18. Specifically, as shown in FIG. 19, The first junction portion JU1 formed in the chip mounting portion TAB is in a concave part shape. It is shown that the second junction portion JU2 formed by subjecting the suspension lead HL to bending processing is fitted into the first junction portion JU1 formed of the concave part.

Also in the present first modified example thus configured, as with the foregoing embodiment, when the second junction portion JU2 is fixed to the first junction portion JU1, finally, there is no gap between the first junction portion JU1 and the second junction portion JU2. This can provide a remarkable effect of enabling the sure fixing between the chip mounting portion TAB and the suspension lead HL.

Further, in the present first modified example, each coupling portion for coupling the chip mounting portion TAB and the suspension lead HL is disposed at each corner portion of the chip mounting portion TAB in a rectangular shape. Therefore, it is possible to dispose a plurality leads LD in a high density without being hindered by the coupling portion. Namely, in the present first modified example, the coupling portion for coupling the chip mounting portion TAB and the suspension lead HL is disposed at each corner portion of the chip mounting portion TAB. For this reason, it is possible to dispose a plurality of leads LD around the whole periphery of the four sides of the chip mounting portion TAB. As a result, in accordance with the present first modified example, even in the case of a lead frame of a type in which the chip mounting portion TAB and the suspension lead HL respectively formed of mutually separate bodies are fixed, it is possible to dispose a plurality of leads LD around the chip mounting portion TAB in a high density without being hindered by the coupling portion. This means that the semiconductor device can be reduced in size. In other words, in the present first modified example, as with the foregoing embodiment, it is possible to obtain the following remarkable effects: the coupling reliability between the chip mounting portion TAB and the suspension lead HL can be improved; and the size reduction of the semiconductor device can be implemented.

Figure 20A:
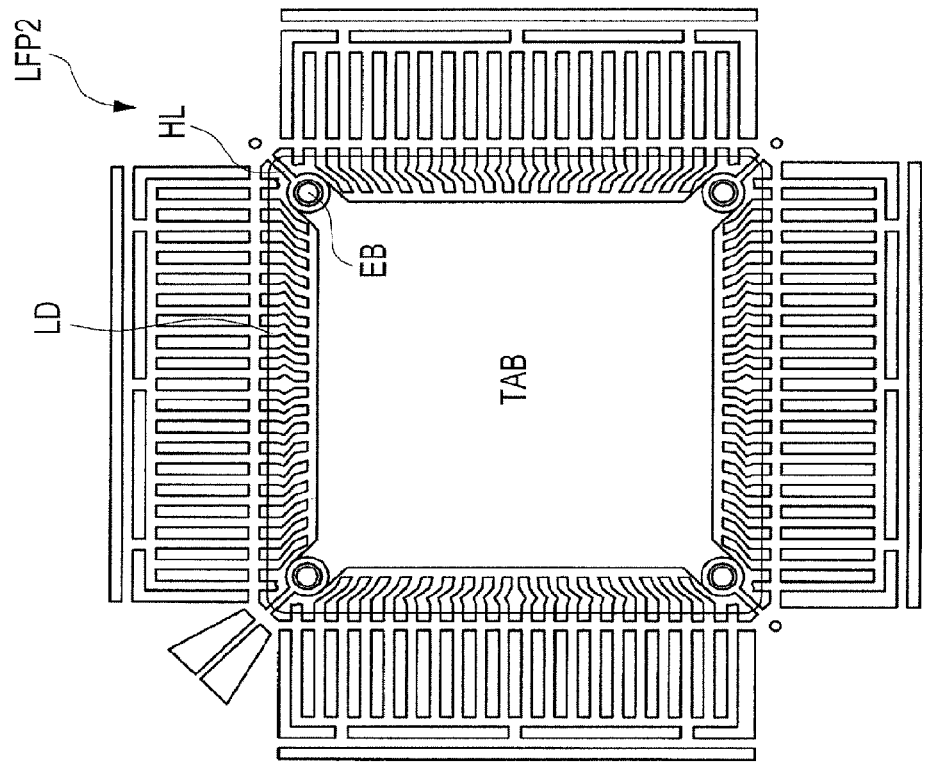
FIG. 20A is a plan view showing a configuration of the lead frame in the first modified example.
Figure 20B:
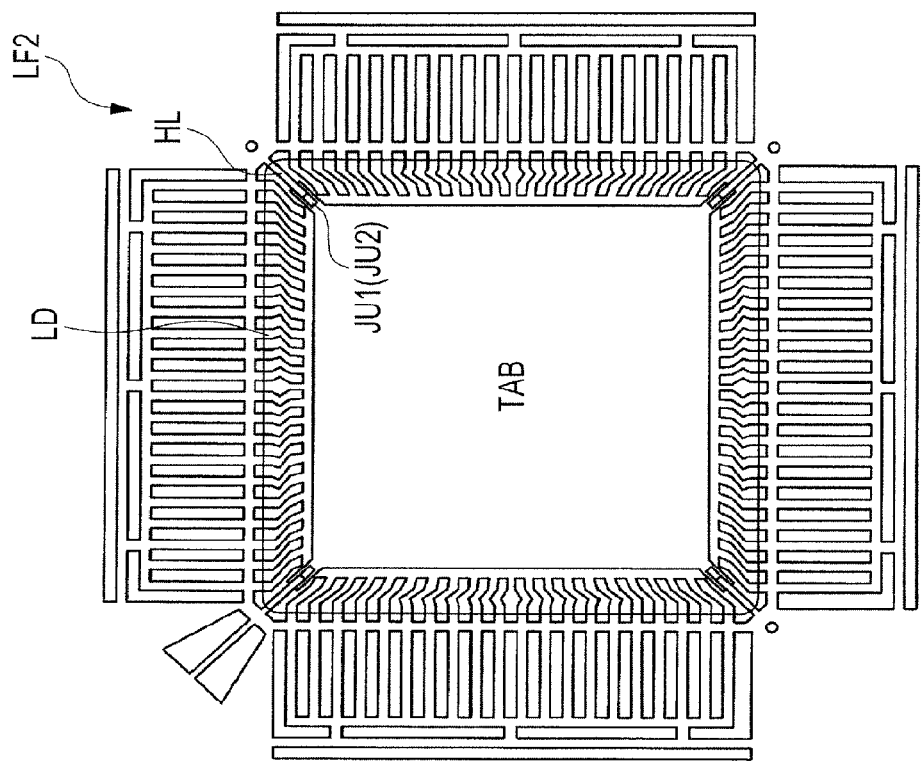
FIG. 20B is a plan view showing a configuration of a lead frame in a study example.

Below, the superiority of the semiconductor device in the present first modified example will be described with comparison with the study example studied by the present inventors. FIG. 20A is a plan view showing a configuration of the lead frame LF2 in the present first modified example. FIG. 20B is a plan view showing a configuration of a lead frame LFP2 in the study example. In FIG. 20A, in the lead frame LF2 in the present first modified example, at each corner portion of the chip mounting portion TAB in a rectangular shape, there is formed the coupling portion of the first junction portion JU1 and the second junction portion JU2. In other words, in the present first modified example, in the corner portion of the chip mounting portion TAB, into the first junction portion JU1 formed of a concave part, there is fitted the second junction portion JU2 forming a part of the suspension lead HL. This results in that the chip mounting portion TAB and the suspension lead HL are fixed with each other by the coupling portions. As a result, in accordance with the present first modified example, a plurality of leads LD can be disposed in a high density along the periphery of the four sides of the chip mounting portion TAB in a rectangular shape without being hindered by the coupling portions. Particularly, as shown in FIG. 20A, for example, in the present modified example, 20 leads LD can be disposed along one side of the chip mounting portion TAB.

In contrast, also in the study example shown in FIG. 20B, at each corner portion of the chip mounting portion TAB in a rectangular shape, there is formed a coupling portion for coupling the chip mounting portion TAB and the suspension lead HL. However, in the study example, the coupling portion is formed by inserting the embossed part EB subjected to embossing into the opening disposed in the suspension lead HL, and crushing the top of the embossed part EB. At this step, as shown in FIG. 20B, the size of the embossed part EB is large. For this reason, the coupling portion of the study example shown in FIG. 20B is larger in occupying area than the coupling portion of the present first modified example shown in FIG. 20A. For example, as shown in FIG. 20B, in the study example, only 18 leads LD can be disposed along one side of the chip mounting portion TAB.

In other words, as shown in FIG. 20B, in the case where the coupling portion by embossing is adopted, even if the coupling portion is disposed at each corner portion of the chip mounting portion TAB, it is larger in size than the coupling portion in the present first modified example shown in FIG. 20A. Thus, with the configuration of the coupling portion in the present first modified example in which into the first junction portion JU1 formed of a concave part, there is fitted the second junction portion JU2 forming a part of the suspension lead HL, it is possible to improve the coupling reliability, and it is also possible to reduce the size of the coupling portion itself. This indicates as follows: when there is adopted the configuration of the coupling portion in the present first modified example in which the second junction portion JU2 forming a part of the suspension lead HL is fitted into the first junction portion JU1 formed of a concave part, for example, as shown in FIG. 20A, as compared with the study example shown in FIG. 20B, not only the coupling reliability can be improved, but also the occupying area of the coupling portion can also be reduced.

Specifically, for example, in the case of the present first modified example shown in FIG. 20A, 20 leads LD can be disposed along one side of the chip mounting portion TAB. In contrast, in the case of the study example shown in FIG. 20B, only 18 leads LD can be disposed along one side of the chip mounting portion TAB. This means the following: the total number of the leads LD disposed along the four sides of the chip mounting portion TAB is 80 for the case of the present first modified example shown in FIG. 20A, and is 72 for the case of the study example shown in FIG. 20B; and the difference therebetween is as much as 8. This means as follows: when the lead frame LF2 and the lead frame LFP2 are made equal in size to each other, the present first modified example can dispose the leads LD in a higher density than the study example. In other words, this means as follows: when the same number of leads LD are formed in the lead frame LF2 and the lead frame LFP2, respectively, the size of the lead frame LF2 of the present first modified example can be set smaller than the size of the lead frame LFP2 of the study example.

Figure 21A:
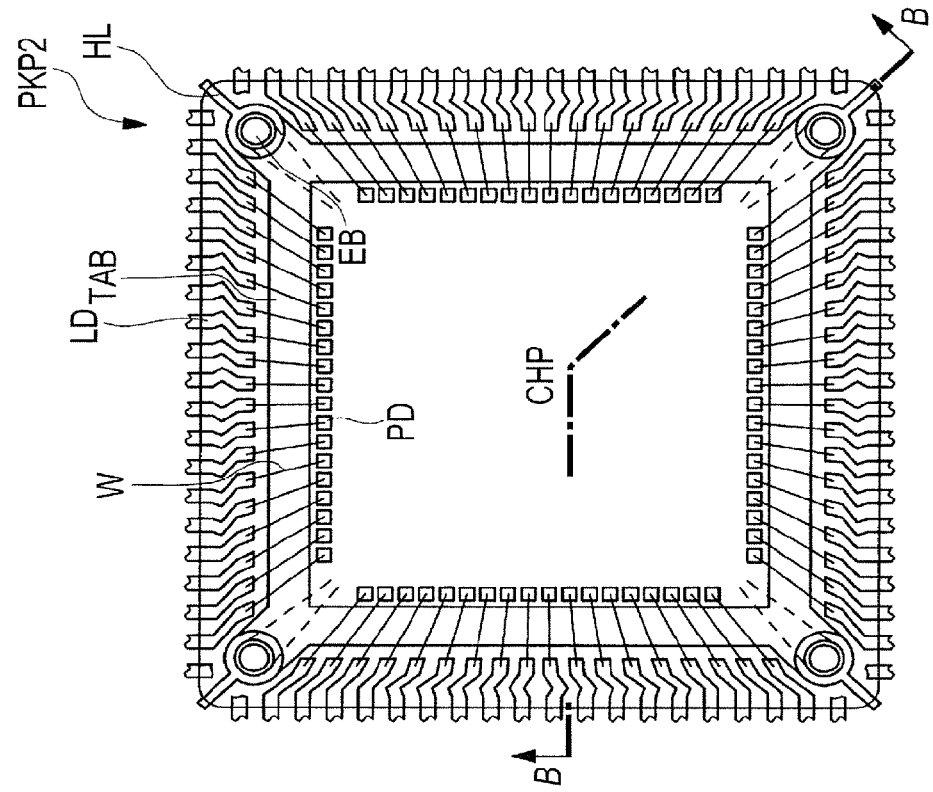
FIG. 21A is a plan view showing a configuration of a semiconductor device in the first modified example.
Figure 21B:
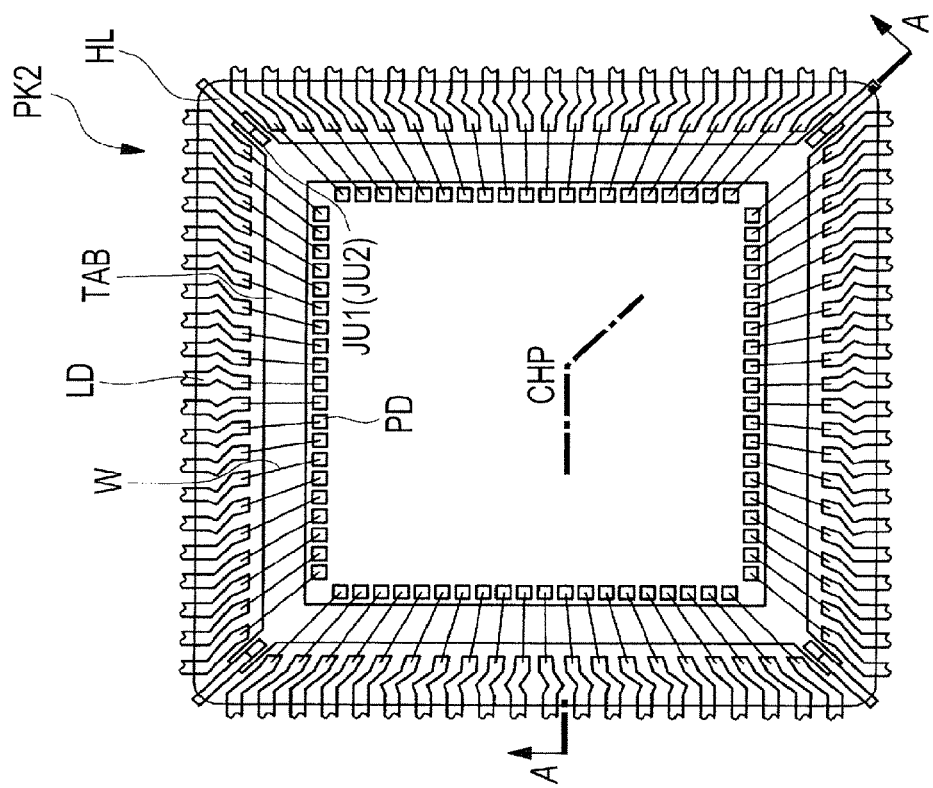
FIG. 21B is a plan view showing a configuration of a semiconductor device in the study example.

Subsequently, FIG. 21A is a plan view showing a configuration of the semiconductor device PK2 in the present first modified example. FIG. 21B is a plan view showing a configuration of the semiconductor device PKP2 in the study example. First, in FIG. 21A, the semiconductor device PK2 in the present first modified example is formed using the lead frame LF2 shown in FIG. 20A. Specifically, over the chip mounting portion TAB, there is mounted the semiconductor chip CHP. Along the outer edge part of the semiconductor chip CHP, there are disposed a plurality of pads PD. Each of the plurality of pads PD is electrically coupled with each lead LD disposed around the semiconductor chip CHP by the wire W.

At this step, in the semiconductor device PK2 in the present first modified example, at each corner portion of the chip mounting portion TAB, the second junction portion JU2 is fitted into the first junction portion JU1. Thus, the chip mounting portion TAB and the suspension lead HL are fixed to each other. As a result of this, in the present first modified example shown in FIG. 21A, 20 leads LD can be disposed along one side of the chip mounting portion TAB. Therefore, in the semiconductor chip CHP in the present first modified example, along one side of the semiconductor chip CHP in a rectangular shape, there can be disposed, for example, 20 pads PD. It results that the 20 pads PD are electrically coupled with the 20 leads LD by the wires W, respectively.

On the other hand, in FIG. 21B, the semiconductor device PKP2 in the study example is formed using the lead frame LFP2 shown in FIG. 20B. Specifically, also in the semiconductor device PKP2 in the study example, over the chip mounting portion TAB, there is mounted the semiconductor chip CHP. Along the outer edge part of the semiconductor chip CHP, there are disposed a plurality of pads PD. Each of the plurality of pads PD is electrically coupled with each lead LD disposed around the semiconductor chip CHP by the wire W. At this step, in the semiconductor device PKP2 in the study example, at each corner portion of the chip mounting portion TAB, the embossed part EB subjected to embossing is inserted into the opening formed in the suspension lead HL, and the top of the embossed part EB is crushed. As a result, the chip mounting portion TAB and the suspension lead HL are fixed to each other. This results in that, in the study example shown in FIG. 21B, only 18 leads LD can be disposed along one side of the chip mounting portion TAB. Therefore, in the semiconductor chip CHP in the study example, along one side of the semiconductor chip CHP in a rectangular shape, for example, only 18 pads PD can be disposed. The 18 pads PD are electrically coupled with 18 leads LD by wires W, respectively.

The description up to this point indicates as follows: when the size of the semiconductor device PK2 in the present first modified example shown in FIG. 21A, and the size of the semiconductor device PKP2 in the study example shown in FIG. 21B are made equal to each other, the present first modified example can dispose the leads LD in a higher density than the study example. In other words, this means as follows: when the same number of leads LD are formed in the semiconductor device PK2 in the present first modified example and the semiconductor device PKP2 in the study example, respectively, the size of the semiconductor device PK2 in the present first modified example can be set smaller than the size of the semiconductor device PKP2 in the study example. This indicates as follows: in accordance with the present first modified example, not only the coupling reliability between the chip mounting portion TAB and the suspension lead HL can be improved, but also the size of the semiconductor device PK2 can be reduced.

Then, FIG. 22A shows a cross-sectional view cut along line A-A of FIG. 21A showing the present first modified example. FIG. 22B shows a cross-sectional view cult along line B-B of FIG. 21B showing the study example. First, in the present first modified example shown in FIG. 22A, over the chip mounting portion TAB, there is mounted the semiconductor chip CHP. Each pad PD formed at the semiconductor chip CHP, and each lead LD processed into a gull-wing shape are electrically coupled with each other by the wire W. Further, the chip mounting portion TAB and the suspension lead HL are coupled to each other by fitting the second junction portion JU2 forming a part of the suspension lead HL into the first junction portion JU1 formed of a concave part formed in the chip mounting portion TAB. For this reason, also in the present first modified example, as with the foregoing embodiment, when the second junction portion JU2 is fixed to the first junction portion JU1, finally, there is no gap between the first junction portion JU1 and the second junction portion JU2. This can provide an effect of enabling the sure fixing between the chip mounting portion TAB and the suspension lead HL.

Incidentally, in FIG. 22A, the sealing body MR formed of, for example, a resin is formed in such a manner as to cover the semiconductor chip CHP, the wire W, a part of the lead LD, and, the suspension lead. Then, as apparent from FIG. 22A, the thickness of the chip mounting portion TAB is sufficiently larger than the thickness of the lead LD and the thickness of the suspension lead HL. This results in a larger heat capacity of the chip mounting portion TAB. Whereas, the back surface (bottom surface) of the chip mounting portion TAB is exposed from the sealing body MR. Accordingly, the heat generated at the semiconductor chip CHP is efficiently dissipated from the chip mounting portion TAB to outside the semiconductor device PK2.

On the other hand, also in the study example shown in FIG. 22B, over the chip mounting portion TAB, there is mounted the semiconductor chip CHP. The pads PD formed at the semiconductor chip CHP and the leads LD each processed into a gull-wing shape are electrically coupled with each other by the wires W, respectively. Further, the chip mounting portion TAB and the suspension lead HL are fixed to each other by inserting the embossed part EB subjected to embossing into the opening formed in the suspension lead HL, and crushing the top of the embossed part EB. For this reason, in the study example shown in FIG. 22B, the diameter of the opening is required to have a margin, so that looseness becomes more likely to occur. In contrast, in the present first modified example, for example, as shown in FIG. 22A, the second junction portion JU2 forming a part of the suspension lead HL is fitted into the first junction portion JU1 in a concave shape. As a result, the chip mounting portion TAB and the suspension lead HL are physically fixed. For this reason, there is no gap between the first junction portion JU1 and the second junction portion JU2. This indicates that the chip mounting portion TAB and the suspension lead HL can be fixed surely.

Incidentally, also in FIG. 22B, the sealing body MR formed of, for example, a resin is formed in such a manner as to cover the semiconductor chip CHP, the wire W, a part of the lead LD, and, the suspension lead. Then, as apparent from FIG. 22B, the thickness of the chip mounting portion TAB is sufficiently larger than the thickness of the lead LD and the thickness of the suspension lead HL. This results in a larger heat capacity of the chip mounting portion TAB. Whereas, the back surface (bottom surface) of the chip mounting portion TAB is exposed from the sealing body MR. Accordingly, the heat generated at the semiconductor chip CHP is efficiently dissipated from the chip mounting portion TAB to outside the semiconductor device PKP2.

However, in the study example shown in FIG. 22B, in the bottom surface of the chip mounting portion TAB subjected to embossing, there is formed a concave part. In the concave part, a resin is filled. For this reason, in the study example shown in FIG. 22B, the area of the bottom surface of the chip mounting portion TAB exposed from the sealing body MR becomes small. In contrast, in the present first modified example shown in FIG. 22A, embossing is not performed, so that the bottom surface of the chip mounting portion TAB is flat. As a result, it is possible to set large the area of the bottom surface of the chip mounting portion TAB exposed from the sealing body MR. In other words, it can also be said that the portion at which the chip mounting portion TAB and the suspension lead HL are fixed to each other overlaps the bottom surface of the chip mounting portion TAB in plan view.

As a result, in accordance with the present first modified example shown in FIG. 22A, it is possible to set larger the area of the bottom surface of the chip mounting portion TAB exposed from the sealing body MR than with the study example shown in FIG. 22B. Therefore, in accordance with the present first modified example shown in FIG. 22A, it is possible to dissipate the heat generated at the semiconductor chip CHP to the outside more efficiently than in the study example shown in FIG. 22B. This indicates as follows: in accordance with the present first modified example shown in FIG. 22A, it is possible to more suppress the temperature rise in the inside of the sealing body MR than with the study example shown in FIG. 22B; this can suppress the thermal runaway due to the heat of the semiconductor chip CHP sealed by the sealing body MR. In other words, with the semiconductor device PK2 of the present first modified example shown in FIG. 22A, it is possible to more improve the reliability than with the semiconductor device PKP2 of the study example shown in FIG. 22B.

Figure 23A:
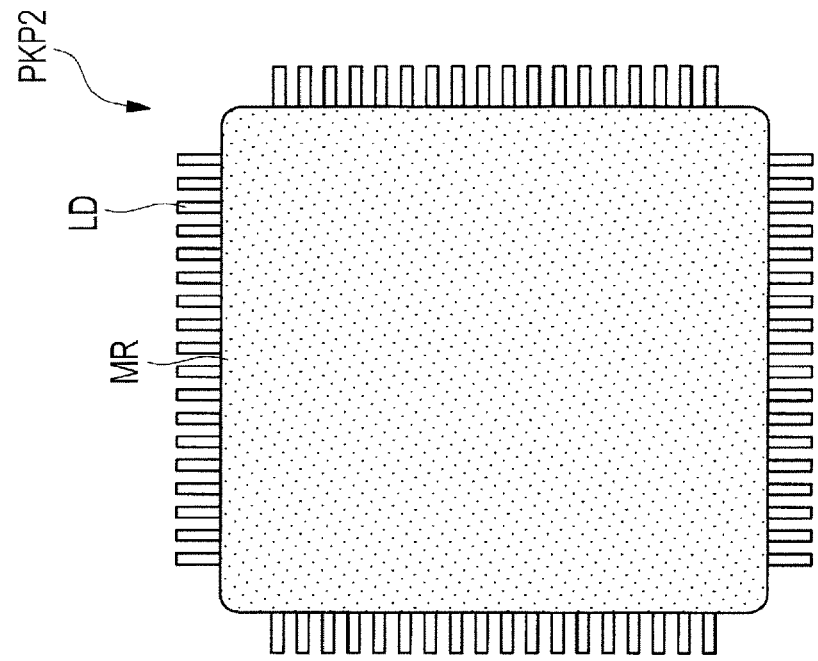
FIG. 23A is a top view showing an outside configuration of the semiconductor device in the first modified example.
Figure 23B:
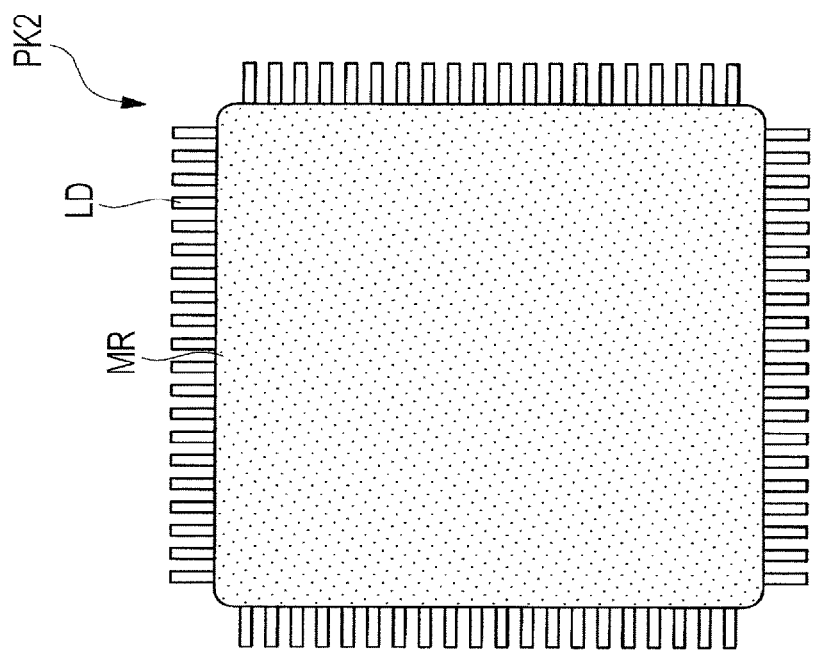
FIG. 23B is a top view showing an outside configuration of the semiconductor device in the study example.

Subsequently, FIG. 23A is a top view showing the outside configuration of the semiconductor device PK2 in the present first modified example. FIG. 23B is a top view showing the outside configuration of the semiconductor device PKP2 in the study example. In FIG. 23A, the outside shape of the semiconductor device PK2 in the present first modified example is a generally rectangular shape. A portion (referred to as an outer lead) of each lead LD protrudes from the sealing body MR in a generally rectangular shape. At this step, with the semiconductor device PK2 in the present first modified example shown in 23A, 20 leads LD protrude from one side of the sealing body MR. This results in that 80 leads LD protrude from all the four sides of the sealing body MR.

In contrast, also in FIG. 23B, the outside shape of the semiconductor device PKP2 in the study example is a generally rectangular shape. A portion (referred to as an outer lead) of each lead LD protrudes from the sealing body MR in a generally rectangular shape. At this step, with the semiconductor device PKP2 in the study example shown in 23B, 18 leads LD protrude from one side of the sealing body MR. This results in that 72 leads LD protrude from all the four sides of the sealing body MR.

Therefore, it is indicated as follows: when the size of the semiconductor device PK2 in the present first modified example shown in FIG. 23A and the size of the semiconductor device PKP2 in the study example shown in FIG. 23B are equal to each other, in accordance with the present first modified example, it is possible to dispose the leads LD in a higher density than with the study example. This indicates that, in accordance with the present first modified example, it is possible to reduce the size of the semiconductor device PK2.

Further, FIG. 24A is a bottom view showing the outside configuration of the semiconductor device PK2 in the present first modified example. FIG. 24B is a bottom view showing the outside configuration of the semiconductor device PKP2 in the study example. In the present first modified example shown in FIG. 24A, it is shown that the bottom surface of the chip mounting portion TAB is exposed from the bottom surface of the sealing body MR. Similarly, also in the study example shown in FIG. 24B, it is shown that the bottom surface of the chip mounting portion TAB is exposed from the bottom surface of the sealing body MR. Herein, in the study example shown in FIG. 24B, each corner portion of the chip mounting portion TAB is subjected to embossing. Accordingly, the embossed and dented region is covered with the sealing body MR. On the other hand, in the present first modified example shown in FIG. 24A, embossing is not performed, so that the bottom surface of the chip mounting portion TAB is flat. Thus, the entire bottom surface of the chip mounting portion TAB is exposed from the sealing body MR. As a result, the exposed area of the chip mounting portion TAB in the present modified example shown in FIG. 24A is larger than the exposed area of the chip mounting portion TAB in the study example in FIG. 24B. This can improve the heat radiation efficiency.

Second Modified Example

Then, a second modified example will be described. In the present second modified example, a description will be given to an example in which a wire coupling portion WCN is disposed in a chip mounting portion TAB.

Figure 25:
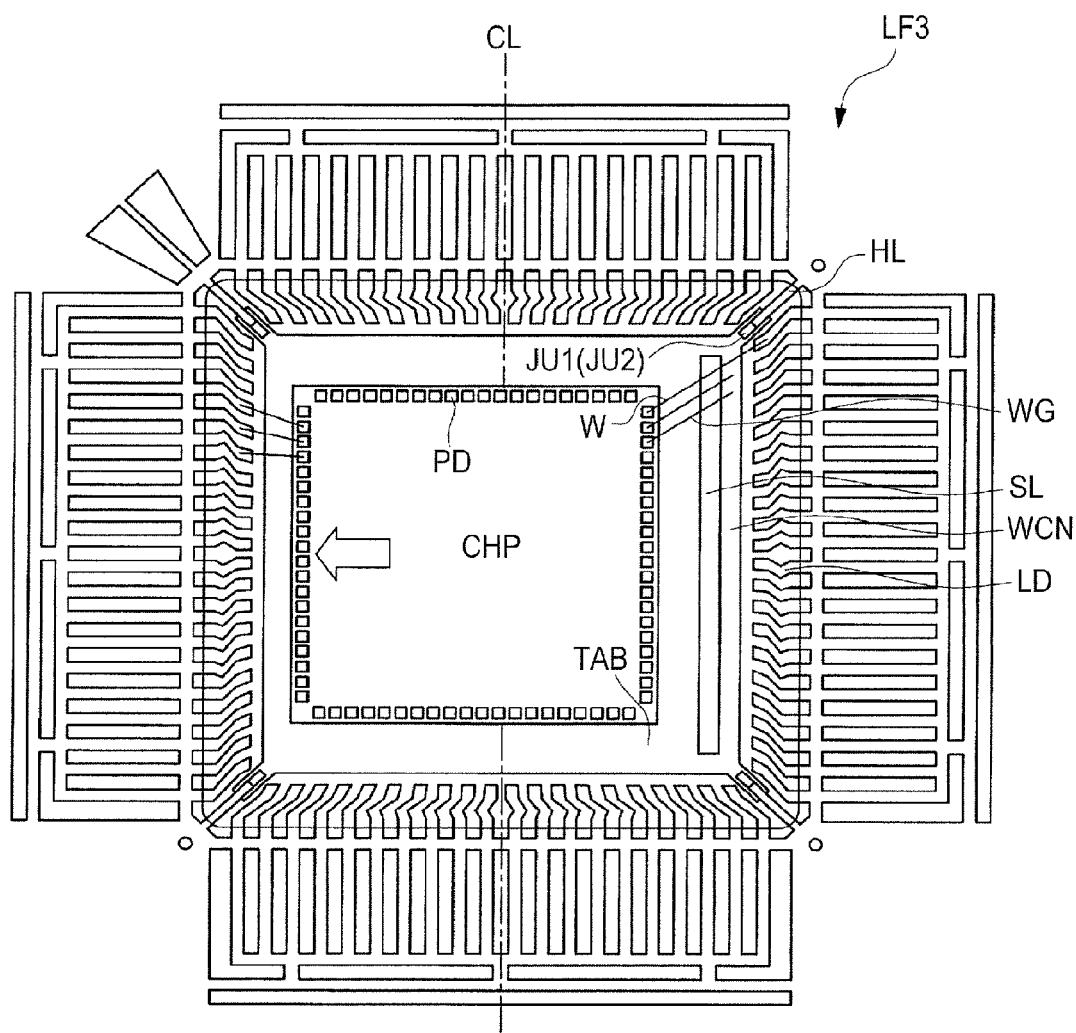
FIG. 25 is a view showing the state of a lead frame in a second modified example after having been subjected to a chip mounting step (die bonding step) and a wire bonding step.

FIG. 25 is a view showing a state of a lead frame LF3 in the second modified example after having been subjected to a chip mounting step (die bonding step) and a wire bonding step. In FIG. 25, in the present second modified example, over the chip mounting portion TAB in a rectangular shape, there is mounted a semiconductor chip CHP. Along the outer edge part of the semiconductor chip CHP in a rectangular shape, there are formed a plurality of pads PD. On the other hand, a plurality of leads LD are disposed in such a manner as to surround the periphery of the chip mounting portion TAB in a rectangular shape. Then, each pad PD formed at the semiconductor chip CHP and each lead LD are electrically coupled with each other by a wire W.

Also in the present second modified example shown in FIG. 25, at each corner portion of the chip mounting portion TAB in a rectangular shape, there is disposed the coupling portion for coupling the chip mounting portion TAB and the suspension lead HL. Therefore, also in the present second modified example, a plurality of leads LD can be disposed in a high density without being hindered by the coupling portion. Namely, also in the present second modified example, the coupling portion for coupling the chip mounting portion TAB and the suspension lead HL is disposed at each corner portion of the chip mounting portion TAB. For this reason, it is possible to dispose a plurality of leads LD around the whole periphery of the four sides of the chip mounting portion TAB. As a result, in accordance with the present second modified example, even in the case of a lead frame LF3 of a type in which the chip mounting portion TAB and the suspension lead HL respectively formed of mutually separate bodies are fixed, it is possible to dispose a plurality of leads LD around the chip mounting portion TAB in a high density without being hindered by the coupling portion. As a result, also in the present second modified example, it is possible to improve the coupling reliability between the chip mounting portion TAB and the suspension lead HL; and it is possible to implement the size reduction of the semiconductor device.

As a result of this, in accordance with the present second modified example, it is possible to ensure a large top surface region of the chip mounting portion TAB. In other words, the area of the chip mounting portion TAB can be ensured without being hindered by the coupling portion for coupling the chip mounting portion TAB and the suspension lead HL. Thus, in the present second modified example, the ensured space will be effectively used.

As shown in FIG. 25, a feature of the present second modified example resides in that a wire coupling portion WCN is disposed in the chip mounting portion TAB. In other words, a feature of the present second modified example resides in that the wire coupling portion WCN is disposed in the space in the chip mounting portion TAB ensured by forming each coupling portion for coupling the chip mounting portion TAB and the suspension lead HL at each corner portion of the chip mounting portion TAB. Namely, in the present second modified example, as shown in FIG. 25, in the chip mounting portion TAB, there is formed the wire coupling portion WCN. Then, the pad PD formed at the semiconductor chip CHP includes therein a reference potential supplying pad for supplying a reference potential (GND potential). The reference potential supplying pad and the wire coupling portion WCN are electrically coupled by a reference potential wire WG. This can improve the stability of the reference potential to be supplied to the semiconductor chip CHP. Namely, a reference potential is externally supplied to the wire coupling portion WCN formed at the chip mounting portion TAB, and the wire coupling portion WCN and the semiconductor chip CHP are coupled by a plurality of reference potential wires WG. This can reduce the resistance between the semiconductor chip CHP and the wire coupling portion WCN. As a result, it is possible to reduce the fluctuations in potential, which enables supply of a stable reference potential to the semiconductor chip CHP.

At this step, the wire coupling portion WCN formed at the chip mounting portion TAB can be formed in the outer edge region on the outer side of the chip mounting region including the semiconductor chip CHP mounted therein of the top surface region of the chip mounting portion TAB. Particularly, in the present second modified example, as shown in FIG. 25, the disposition is desirably achieved so that the center of the semiconductor chip CHP is deviated from the center line CL of the chip mounting portion TAB. The reason for this is as follows: for example, as shown in FIG. 25, the semiconductor chip CHP is disposed in such a manner as to be deviated to the left side with respect to the centerline CL; as a result, a large space can be ensured in the region on the right-hand side of the center line CL of the chip mounting portion TAB, which facilitates the formation of the wire coupling portion WCN in this space.

Herein, in the present second modified example, as shown in FIG. 25, in plan view, a slit SL is formed in the top surface region of the chip mounting portion TAB between the chip mounting region TAB and the wire coupling portion WCN. Below, a description will be given to the reason why the slit SL is disposed. For example, from the viewpoint of coupling the wire coupling portion WCN and the semiconductor chip CHP by the reference potential wires WG, it is considered that the slit SL is not required to be disposed.

However, when the slit SL is not disposed, the area of the wire coupling portion WCN becomes large because the semiconductor chip CHP is disposed in a manner deviated to the left side from the center line CL. At this step, the wire coupling portion WCN is also sealed by the sealing body formed of, for example, a resin. In this case, the wire coupling portion WCN itself is in contact with the resin. Then, for example, when the semiconductor device is applied with a thermal load cycle, there is raised the fear that the wire coupling portion WCN is peeled from the sealing body due to the difference in expansion coefficient between the copper material forming the wire coupling portion WCN and the resin forming the sealing body. Further, due to the difference in expansion coefficient between the copper material forming the wire coupling portion WCN and the resin forming the sealing body, a shearing stress is imposed on the reference potential wire WG coupled to the wire coupling portion WCN. This results in an increase in potential that a malfunction leading to disconnection occurs. It can be considered as follows: the larger the contact area between the wire coupling portion WCN and the sealing body becomes, the more this phenomenon is likely to become noticeable.

Thus, in the present second modified example, the slit SL is formed in the top surface region of the chip mounting portion TAB between the chip mounting region and the wire coupling portion WCN. As a result, as shown in FIG. 25, the area of the wire coupling portion WCN can be reduced. This can reduce the contact area between the wire coupling portion WCN and the sealing body. As a result, in accordance with the present second modified example, it is possible to effectively prevent the peeling of the wire coupling portion WCN, and the disconnection of the reference potential wire WG due to the difference in expansion coefficient between the copper material forming the wire coupling portion WCN and the resin forming the sealing body. As described up to this point, it is indicated that the slit SL is disposed in order to suppress the peeling of the wire coupling portion WCN, and the disconnection of the reference potential wire WG.

Figure 26:
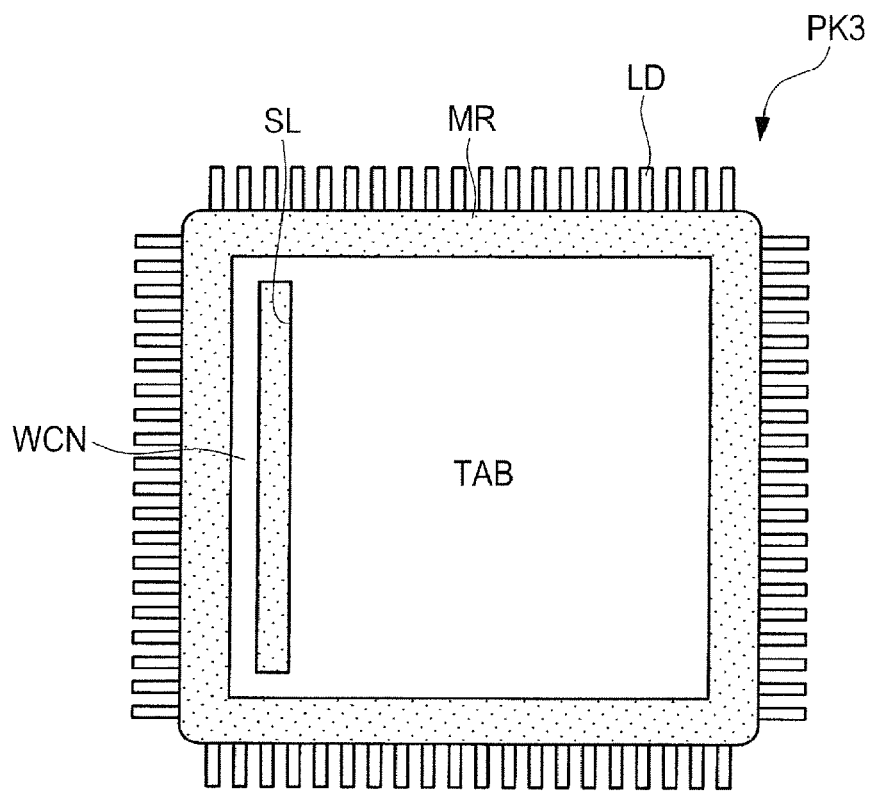
FIG. 26 is a bottom view showing an outside configuration of a semiconductor device in the second modified example.

FIG. 26 is a bottom view showing the outside configuration of the semiconductor device PK3 in the present second modified example. As shown in FIG. 26, it is indicated that a portion (outer lead) of each of a plurality of leads LD protrudes from the sealing body MR in a generally rectangular shape. Then, the bottom surface of the chip mounting portion TAB is exposed at the bottom surface of the sealing body MR formed of, for example, a resin. At this step, in the present second modified example, it is indicated that the slit SL is formed in the chip mounting portion TAB, and that a resin is filled in the inside of the slit SL. Then, in the outside region of the slit SL (the outer edge region of the chip mounting portion TAB), there is disposed the wire coupling portion WCN. The bottom surface of the wire coupling portion WCN is also exposed from the sealing body MR. Thus, also in the present second modified example, the bottom surface of the chip mounting portion TAB including the wire coupling portion WCN is exposed. For this reason, the heat generated from the semiconductor chip covered with the sealing body MR can be efficiently dissipated to the outside.

Figure 27:
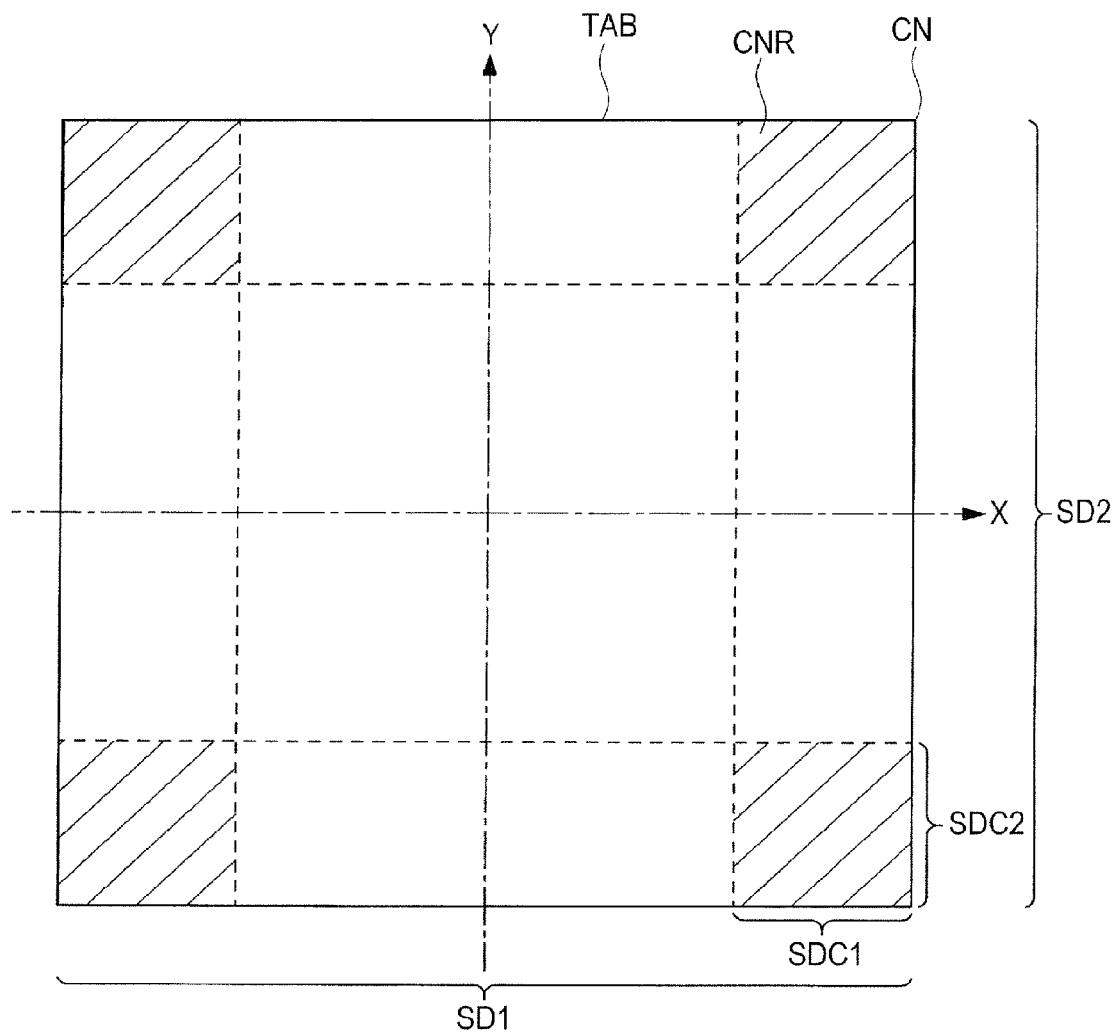
FIG. 27 is a view for illustrating the definition of the corner portion.

Herein, a description will be given to the definition of "the corner portion" of the chip mounting portion TAB in a rectangular shape, in the present specification. FIG. 27 is a schematic view showing the planar shape of the chip mounting portion TAB. In FIG. 27, the center of the chip mounting portion TAB is set as the origin point. The coordinate axis extending in the lateral direction from this center is set as the X axis, and the coordinate axis extending in the longitudinal direction from the center of the chip mounting portion TAB is set as the Y axis. When the X axis and the Y axis are thus defined, the chip mounting portion TAB is divided into the first quadrant to the fourth quadrant by the coordinate axes formed of the X axis and the Y axis. At this step, each quadrant includes each "corner CN" of the chip mounting portion TAB. The term "the corner portion CNR" used in the present specification is defined as a diagonally shaded region included in each quadrant. Specifically, "the corner portion CNR" used in the present specification is formed of a rectangular region. Then, the side SDC1 forming the rectangular region is smaller than ¼ the side SD1 of the chip mounting portion TAB. The side SDC2 forming the rectangular region is smaller than ¼ the side SD2 of the chip mounting portion TAB.

Third Modified Example

Then, a third modified example will be described. In the present third modified example, a description will be given to an example in which on the extension of each corner portion of the chip mounting portion TAB, there is disposed a coupling portion for coupling the chip mounting portion TAB and the suspension lead HL.

Figure 28:
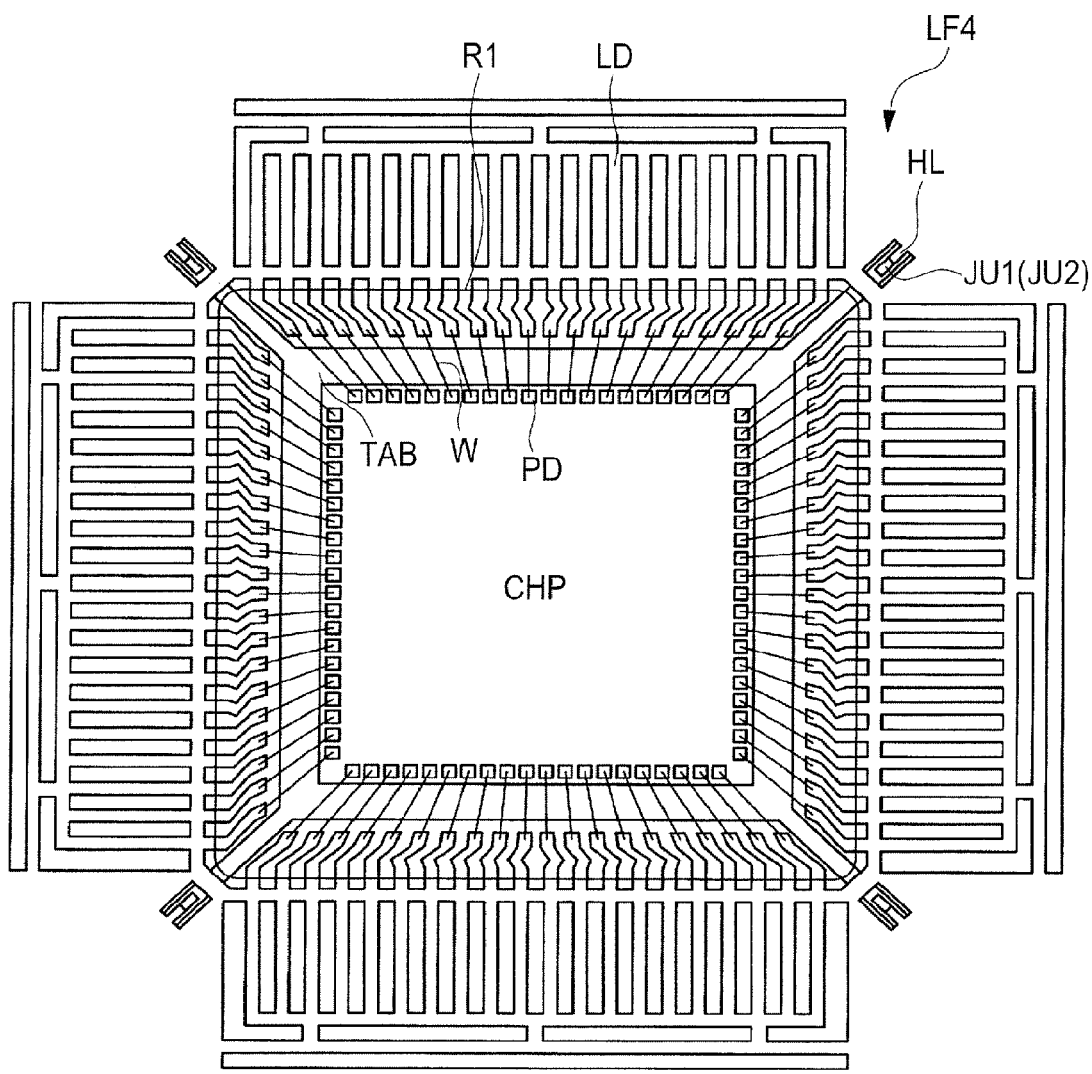
FIG. 28 is a view showing the state of a lead frame in a third modified example after having been subjected to a chip mounting step (die bonding step) and a wire bonding step.

FIG. 28 is a view showing the state of a lead frame LF4 in the present third modified example after having been subjected to the chip mounting step (die bonding step) and the wire bonding step. In FIG. 28, in the present third modified example, over the chip mounting portion TAB in a rectangular shape, there is mounted a semiconductor chip CHP. A plurality of pads PD are formed along the outer edge part of the semiconductor chip CHP in a rectangular shape. On the other hand, a plurality of leads LD are disposed in such a manner as to surround the periphery of the chip mounting portion TAB in a rectangular shape. Then, the pads PD formed at the semiconductor chip CHP and the leads LD are electrically coupled with each other by the wires W, respectively.

In the present third modified example shown in FIG. 28, on the extension of each corner portion of the chip mounting portion TAB in a rectangular shape, there is disposed a coupling portion for coupling the chip mounting portion TAB and the suspension lead HL. However, in the present third modified example, the coupling portion between the first junction portion JU1 and the second junction portion JU2 is formed outside the sealing region R1 sealed by the sealing body. Even in this case, a plurality of leads LD can be disposed in a high density without being hindered by the coupling portion. Namely, also in the present third modified example, the coupling portion for coupling the chip mounting portion TAB and the suspension lead HL is disposed on the extension of each corner portion of the chip mounting portion TAB. For this reason, a plurality of leads LD can be disposed around the whole periphery of the four sides of the chip mounting portion TAB. As a result, in accordance with the present third modified example, even in the case of a lead frame LF4 of a type in which the chip mounting portion TAB and the suspension lead HL respectively formed of mutually separate bodies are fixed, it is possible to dispose a plurality of leads LD around the chip mounting portion TAB in a high density without being hindered by the coupling portion. As a result, also in the present modified example 3, it is possible to improve the coupling reliability between the chip mounting portion TAB and the suspension lead HL, and it is possible to implement the size reduction of the semiconductor device PK4.

Herein, also in the present third modified example, as with the foregoing embodiment, the semiconductor chip CHP, the wire W, and a part of the lead LD are sealed by a resin. Then, the tie bar formed at the lead frame LF4 is cut. At this step, the coupling portion formed by fitting the second junction portion JU2 into the first junction portion JU1 formed of a concave part is formed outside the sealing region R1. Accordingly, in the tie bar cutting step, the coupling portion is also cut apart. Namely, the first junction portion JU1 and the second junction portion JU2 are cut so as to be separated from the sealing body. As a result, in the present third modified example, the coupling portion is cut apart from the finally formed semiconductor device PK4. As a result, there remains no mark of the coupling portion in the final semiconductor device PK4.

Figure 29:
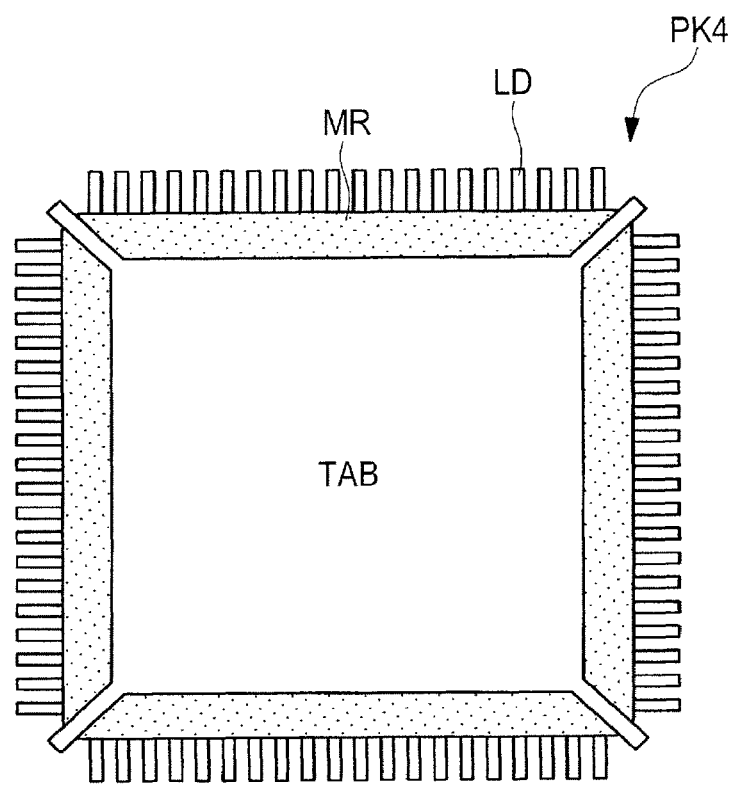
FIG. 29 is a bottom view showing an outside configuration of the semiconductor device in the third modified example.

FIG. 29 is a bottom view showing the outside configuration of the semiconductor device PK4 in the present third modified example. As shown in FIG. 29, it is shown that a portion (outer lead) of each of a plurality of leads LD protrudes from the sealing body MR in a generally rectangular shape. Then, for example, at the bottom surface of the sealing body MR formed of a resin, there is exposed the bottom surface of the chip mounting portion TAB. Thus, also in the present third modified example, the bottom surface of the chip mounting portion TAB is exposed. For this reason, the heat generated from the semiconductor chip covered with the sealing body MR can be efficiently dissipated to the outside.

Fourth Modified Example

Subsequently, a fourth modified example will be described. In the present fourth modified example, a description will be given to a semiconductor device PK5 in which over the semiconductor chip CHP1, there is mounted another semiconductor chip CHP2.

Figure 30:
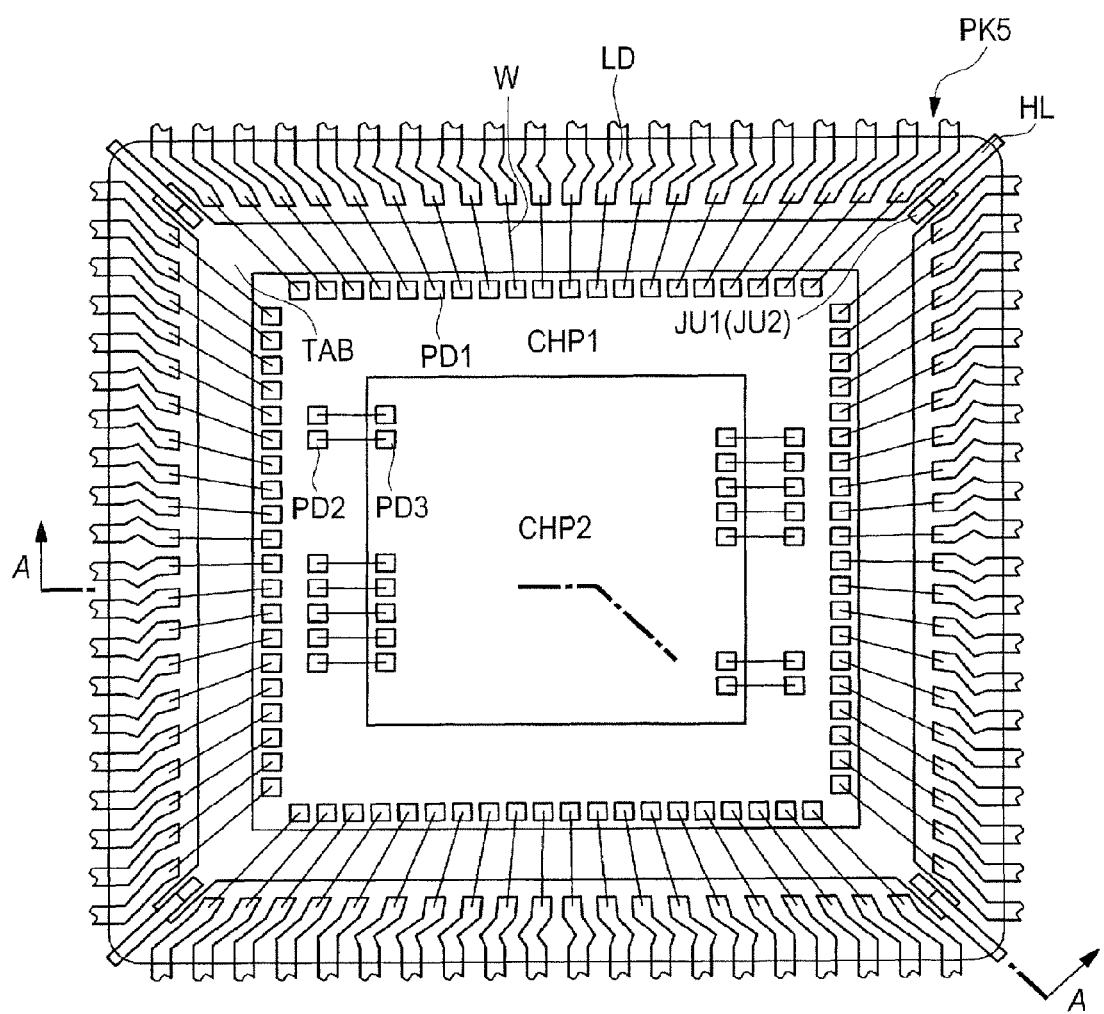
FIG. 30 is a view showing the configuration of a semiconductor device in a fourth modified example.
Figure 31:
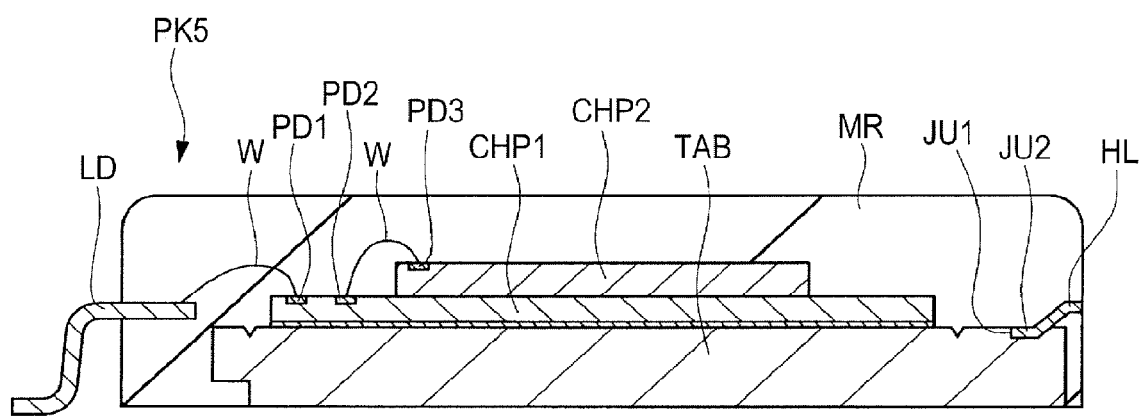
FIG. 31 is a cross-sectional view cut along line A-A of FIG. 30.

FIG. 30 is a view showing a configuration of the semiconductor device PK5 in the present fourth modified example. FIG. 31 is a cross-sectional view cut along line A-A of FIG. 30. In FIG. 30, in the semiconductor device PK5 in the present fourth modified example, over the chip mounting portion TAB, there is mounted the semiconductor chip CHP1. A plurality of pads PD1 are disposed along the outer edge part of the semiconductor chip CHP1. The plurality of pads PD1 are electrically coupled with the leads LD disposed around the semiconductor chip CHP1 by the wires W, respectively. Further, in the present fourth modified example, over the semiconductor chip CHP1, there is mounted another semiconductor chip CHP2. In other words, in the present fourth modified example, over the chip mounting portion TAB, there are mounted the stacked semiconductor chip CHP1 and semiconductor chip CHP2. Then, over the main surface (front surface) of the semiconductor chip CHP2, there are formed a plurality of pads PD3 different from the plurality of pads PD1 inwardly of the plurality of pads PD1. The plurality of pads PD3 are electrically coupled with the pads PD2 formed at the surface of the semiconductor chip CHP1 by the wires W, respectively. Herein, also in the semiconductor device PK5 in the present fourth modified example, at each corner portion of the chip mounting portion TAB, the chip mounting portion TAB and the suspension lead HL are fixed with each other by the first junction portion JU1 and the second junction portions JU2. As a result, also in the present fourth modified example, it is possible to implement the size reduction of the semiconductor device PK5.

Then, as shown in FIG. 31, in the semiconductor device PK5 in the present fourth modified example, over the chip mounting portion TAB, there is mounted the semiconductor chip CHP1. The pad PD1 formed at the semiconductor chip CHP1 and the lead LD processed into a gull-wing shape are electrically coupled with each other by each wire W. Then, over the semiconductor chip CHP1, there is mounted the semiconductor chip CHP2. The pad PD2 formed at the semiconductor chip CHP1 and the pad PD3 formed at the semiconductor chip CHP2 are electrically coupled with each other by each wire W.

Further, as shown in FIG. 31, the chip mounting portion TAB and the suspension lead HL are coupled with each other by fitting the second junction portion JU2 forming a part of the suspension lead HL into the first junction portion JU1 formed of a concave part formed in the chip mounting portion TAB. For this reason, also in the present fourth modified example, as with the foregoing embodiment, when the second junction portion JU2 is fixed to the first junction portion JU1, finally, there is not gap between the first junction portion JU1 and the second junction portion JU2. This can provide an effect of enabling the sure fixing between the chip mounting portion TAB and the suspension lead HL.

Incidentally, in FIG. 31, the sealing body MR formed of, for example, a resin is formed in such a manner as to cover the semiconductor chip CHP1, the semiconductor chip CHP2, the wire W, a part of the lead LD, and the suspension lead HL. Then, as apparent from FIG. 31, the thickness of the chip mounting portion TAB is sufficiently larger than the thickness of the lead LD, and the thickness of the suspension lead HL. This results in a larger heat capacity of the chip mounting portion TAB. Further, the back surface (bottom surface) of the chip mounting portion TAB is exposed from the sealing body MR. For this reason, the heat generated at the semiconductor chip CHP1 or the semiconductor chip CHP2 is efficiently dissipated from the chip mounting portion TAB to outside the semiconductor device PK5.

Particularly, in the present fourth modified example, over the chip mounting portion TAB, the semiconductor chip CHP1 and the semiconductor chip CHP2 are disposed in a stacked manner. For this reason, in the present fourth modified example, the semiconductor chip CHP1 and the semiconductor chip CHP2 both become heat sources, and hence a higher heat radiation efficiency is required. In this regard, in the present fourth modified example, as described above, the thickness of the chip mounting portion TAB becomes thick, resulting in a larger heat capacity, and the bottom surface of the chip mounting portion TAB is exposed from the sealing body MR. Accordingly, in the present fourth modified example, even when there are a plurality of heat sources such as the semiconductor chip CHP1 and the semiconductor chip CHP2, the heat generated from the heat sources can be efficiently dissipated to the outside. At this step, in the present fourth modified example, the semiconductor chip CHP1 which is more likely to generate heat is desirably disposed at the lower layer. The reason for this is as follows: the semiconductor chip CHP1 disposed at the lower layer is in direct contact with the chip mounting portion TAB serving as a heat sink; accordingly, the heat generated at the semiconductor chip CHP1 disposed at the lower layer can be efficiently dissipated from the chip mounting portion TAB to the outside. For example, of the stacked semiconductor chips, at the lower layer, there can be disposed a control circuit semiconductor chip including a control circuit formed therein, and at the upper layer, there can be disposed a memory semiconductor chip including a memory circuit formed therein.

Up to this point, the inventions made by the present inventors were specifically described based on the embodiments thereof. However, it is naturally understood that the present invention is not limited to the embodiments, and may be variously changed within the scope not departing from the gist thereof.

Incidentally, the MOSFET is not limited to the case where the gate insulation film is formed of an oxide film, and is assumed to include even a MISFET (Metal Insulator Semiconductor Field Effect Transistor) in which the gate insulation film is formed of generally an insulation film. In other words, in the present specification, the term "MOSFET" is used for convenience. However, the term "MOSFET" is used as a term intended to include even MISFET in the present specification.

The present invention can be widely used for manufacturing industries for manufacturing semiconductor devices.

What is claimed is:

1. A method for manufacturing a semiconductor device, comprising steps of:
   (a) preparing a lead frame having a suspension lead and a plurality of leads, and having a first member fixed with the suspension lead;
   (b) after the step (a), mounting a semiconductor chip over the first member;
   (c) after the step (b), electrically coupling each of a plurality of pads disposed at the surface of the semiconductor chip with each of the plurality of leads by a wire respectively;
   (d) after the step (c), sealing the semiconductor chip, a portion of the suspension lead, a portion of each of the plurality of leads and the wires by a sealing body; and
   (e) after the step (d), cutting a portion of the suspension lead and a portion of each of the plurality of leads exposed from the sealing body,
   wherein the fixing between the first member and the suspension lead is performed by fitting a second junction portion of the suspension lead into a first junction portion formed of a concave part formed in the first member.

2. The method for manufacturing a semiconductor device according to claim 1,
   wherein the first junction portion and the second junction portion are sealed by the sealing body.

3. The method for manufacturing a semiconductor device according to claim 1,
   wherein the first junction portion and the second junction portion are formed on an outer side of the sealing body, and
   wherein in the step (e), the first junction portion and the second junction portion are cut so as to be separated from the sealing body.

4. A method for manufacturing a semiconductor device, comprising steps of:
   (a) preparing a lead frame having a suspension lead and a plurality of leads, and having a first member fixed with the suspension lead;

(b) after the step (a), mounting a semiconductor chip over the first member;
(c) after the step (b), electrically coupling each of a plurality of pads disposed at the surface of the semiconductor chip with each of the plurality of leads by a wire, respectively;
(d) after the step (c), sealing the semiconductor chip, a portion of the suspension lead, a portion of each of the plurality of leads and the wires by a sealing body; and
(e) after the step (d), cutting a portion of the suspension lead and a portion of each of the plurality of leads exposed from the sealing body,
wherein, in the lead frame prepared by the step (a), a second junction portion of the suspension lead is fixed to a first junction portion formed of a concave part formed in the first member by fitting the second junction portion into the first junction portion, and
wherein an end of the first junction portion is crushed such that the end thereof covers an end of the second junction portion.

* * * * *